United States Patent
Ito

(10) Patent No.: US 8,498,583 B2
(45) Date of Patent: Jul. 30, 2013

(54) SIGNAL RECEIVING APPARATUS, SIGNAL RECEIVING METHOD AND ELECTRONIC APPARATUS

(75) Inventor: Katsuhisa Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 13/200,931

(22) Filed: Oct. 5, 2011

(65) Prior Publication Data

US 2012/0122416 A1 May 17, 2012

(30) Foreign Application Priority Data

Nov. 16, 2010 (JP) .................................. 2010-255569

(51) Int. Cl.
*H04H 7/00* (2006.01)
(52) U.S. Cl.
USPC ............................................. 455/70; 455/323
(58) Field of Classification Search
USPC .................. 455/70, 102, 107, 108, 130, 205, 455/323, 333, 190.1, 207, 313
See application file for complete search history.

(56) References Cited

U.S. PATENT DOCUMENTS

| | | | |
|---|---|---|---|
| 5,742,189 A * | 4/1998 | Yoshida et al. | 327/113 |
| 5,754,948 A | 5/1998 | Metze | |
| 5,913,155 A * | 6/1999 | Tomiyama | 455/142 |
| 6,711,397 B1 * | 3/2004 | Petrov et al. | 455/324 |
| 6,968,159 B2 * | 11/2005 | Morishige | 455/76 |

FOREIGN PATENT DOCUMENTS

| | | |
|---|---|---|
| JP | 10-256478 A | 9/1998 |
| JP | 2005-204221 A | 7/2005 |
| JP | 2005-223411 A | 8/2005 |

* cited by examiner

*Primary Examiner* — Sonny Trinh
(74) *Attorney, Agent, or Firm* — Rader, Fishman & Grauer PLLC

(57) ABSTRACT

Disclosed herein is a signal receiving apparatus including a frequency conversion section configured to carry out frequency conversion on a modulated signal transmitted to the signal receiving apparatus by adoption of a radio transmission technique, wherein the frequency conversion section carries out the frequency conversion by adoption of a frequency conversion method selected from a plurality of frequency conversion methods adoptable by the frequency conversion section in the frequency conversion to be executed on the modulated signal.

17 Claims, 12 Drawing Sheets

F I G . 1
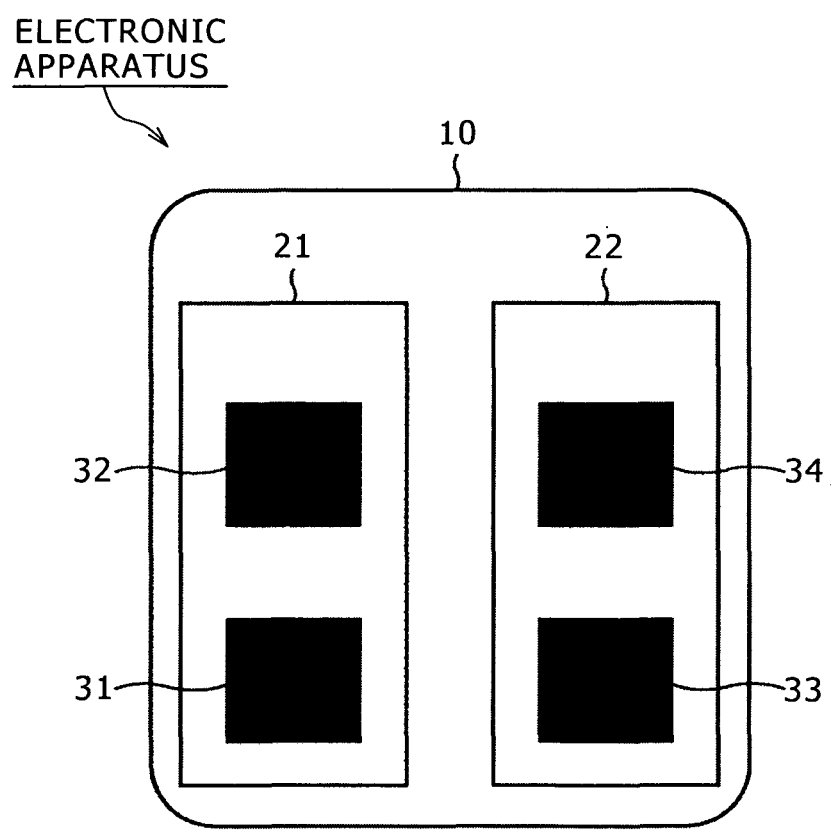

FIG.7

|  | INJECTION-LOCKED DETECTION | SQUARE-LAW DETECTION |
|---|---|---|
| SIGNAL RECEIVING RANGE | BROAD | NARROW (SQUARE CHARACTERISTIC) |
| BAND | BROAD | NARROW (SQUARE CHARACTERISTIC) |
| LOW-RATE TRANSMISSION | INSTABLE SYNCHRONIZATION | POSSIBLE |
| LO FREQUENCY CONTROL | REQUIRED | NOT REQUIRED |
| SELECTION OF SIGNALS IN BB BAND | POSSIBLE | IMPOSSIBLE |

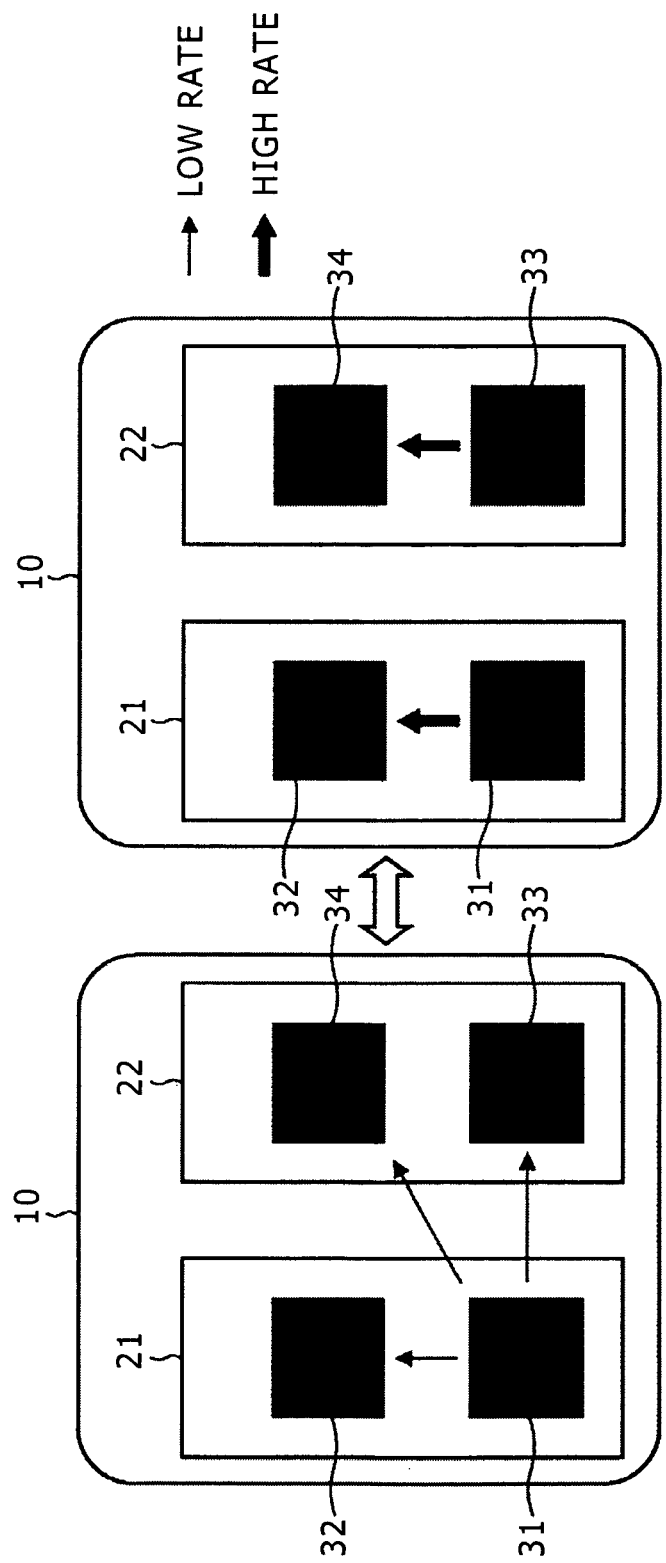

→ LOW RATE
⇒ HIGH RATE

SIGNAL RECEIVING APPARATUS, SIGNAL RECEIVING METHOD AND ELECTRONIC APPARATUS

BACKGROUND

In general, the present technology relates to a signal receiving apparatus, a signal receiving method and an electronic apparatus. More particularly, the present technology relates to a signal receiving apparatus capable of carrying out frequency conversion for converting a modulated signal into a baseband signal with a high degree of flexibility in a radio communication and relates to a signal receiving method adopted by the signal receiving apparatus as well as an electronic apparatus employing the signal receiving apparatus.

For example, in the case of each of a variety of electronic apparatus such as a TV receiver, a video camera and a recorder, a board on which semiconductor chips are mounted is accommodated. The semiconductor chips include ICs (Integrated Circuits) and LSIs (Large Scale Integrations). The ICs and the LSIs each carry out various kinds of signal processing.

Since data is exchanged between semiconductor chips mounted on the same board and semiconductor chips mounted on different boards, the semiconductor chips are connected to each other by wires. In addition, the boards are also connected to each other by wires as well. The data is exchanged between the semiconductor chips includes real data such as images and sounds as well as control data.

By the way, in recent years, the semiconductor chip is used for carrying out signal processing on data of a large amount. In this case, the data of a large amount may need to be exchanged between semiconductor chips at a high speed. Typical examples of the data of a large amount are 3D data in addition to high-precision and high-definition data.

In addition, in order to exchange a large amount of data at a high speed, it is necessary to increase the number of wires connecting the semiconductor chips to each other and the boards to each other. In some cases, however, it is difficult to implement a high-frequency policy on the wires.

In order to solve the problems described above, there has been proposed technologies of exchanging data between semiconductor chips by adoption of radio means. For more information on the technologies, the reader is advised to refer to documents such as Japanese Patent Laid-open Nos. 2005-204221, 2005-223411 and Hei 10-256478 and U.S. Pat. No. 5,754,948.

SUMMARY

In a radio communication, a signal transmitting apparatus modulates a carrier in accordance with transmitted data serving as an object of transmission into a modulated signal and transmits the modulated signal to a signal receiving apparatus by adoption of the radio communication technique. Then, the signal receiving apparatus detects the modulated signal in order to carry out frequency conversion for converting the modulated signal into a baseband signal and acquires data corresponding to the transmitted data from the baseband signal. The data acquired from the baseband signal as the data corresponding to the transmitted data is referred to as received data.

There are a variety of methods for detecting the modulated signal. Typical examples of the method for detecting the modulated signal are a synchronous detection method (or a product detection method), a square-law detection method and an envelope detection.

In the case of the synchronous detection method for example, the signal receiving apparatus reproduces a carrier synchronous with the carrier used in the signal transmitting apparatus. The carrier synchronous with the carrier used in the signal transmitting apparatus is referred to as a reproduced carrier. Then, the signal receiving apparatus mixes the reproduced carrier with the modulated signal by multiplying the former by the latter in order to convert the modulated signal into a baseband signal. In the synchronous detection method whereby the reproduced carrier is generated, any one of a variety of methods can be adopted. The adopted method can typically be a method making use of a PLL (Phase-Locked Loop) or a method making use of an injection-locked technique.

Methods for carrying out the frequency conversion can be classified in accordance with the detection method and a method for generating the reproduced carrier.

To put it in detail, the frequency conversion method can be a frequency conversion method for the synchronous detection or a frequency conversion method for the square-law detection whereas the frequency conversion method for the synchronous detection can be a frequency conversion method for generating the reproduced carrier by making use of the PLL or the injection-locked technique.

By the way, if the data exchanged in a radio communication between semiconductor chips is data having a large amount as is the case with data of an image or the like, the data rate of the radio communication is a high speed. If the data exchanged in a radio communication between semiconductor chips is data having a small amount as is the case with the control data, on the other hand, the data rate of the radio communication is a low speed.

In addition, the frequency conversion method may be proper or improper for the low-rate radio communication of the control data.

Thus, if the same frequency conversion method is adopted in all the semiconductor chips accommodated in the case of an electronic apparatus, a problem will be raised in some cases.

It is therefore desired, in order to address the problems described above, to provide a capability of carrying out frequency conversion for converting a modulated signal into a baseband signal with a high degree of flexibility.

A signal receiving apparatus according to a first mode of the present disclosure has a frequency conversion section configured to carry out frequency conversion on a modulated signal transmitted to the signal receiving apparatus by adoption of a radio transmission technique. The frequency conversion section is capable of selecting any one of a plurality of frequency conversion methods adoptable in the frequency conversion to be executed on the modulated signal and is capable of carrying out the frequency conversion by adoption of the selected frequency conversion method.

A signal receiving method according to a first mode of the present disclosure is provided for a signal receiving apparatus having a frequency conversion section configured to carry out frequency conversion on a modulated signal transmitted to the signal receiving apparatus by adoption of a radio transmission technique. The frequency conversion section is capable of selecting any one of a plurality of frequency conversion methods adoptable in the frequency conversion to be executed on the modulated signal and is capable of carrying out the frequency conversion by adoption of the selected frequency conversion method.

As described above, in accordance with the first mode of the present disclosure, the frequency conversion section, which is capable of selecting any one of a plurality of frequency conversion methods adoptable in the frequency conversion to be executed on the modulated signal, carries out the frequency conversion by adoption of the selected frequency conversion method.

An electronic apparatus according to a second mode of the present disclosure has a case for accommodating:

one or more semiconductor chips each including a signal transmitting apparatus created therein for transmitting a modulated signal obtained as a result of modulation of a carrier by adoption of a radio transmission technique; and a plurality of semiconductor chips each including a signal receiving apparatus created therein for receiving the modulated signal;

in the electronic apparatus:

each of the signal receiving apparatus has a frequency conversion section used for carrying out frequency conversion on the modulated signal;

any specific one of the frequency conversion sections is included in a specific one of the semiconductor chips whereas another one of the frequency conversion sections is included in another one of the semiconductor chips; and the specific frequency conversion section carries out the frequency conversion by adoption of a specific frequency conversion method selected from a plurality of frequency conversion methods adoptable for the frequency conversion whereas the other frequency conversion section carries out the frequency conversion by adoption of another frequency conversion method which is selected from the frequency conversion methods adoptable for the frequency conversion as a frequency conversion method different from the specific frequency conversion method.

As described above, in accordance with the second mode of the present disclosure, there is provided an electronic apparatus having a case for accommodating:

one or more semiconductor chips each including a signal transmitting apparatus created therein for transmitting a modulated signal obtained as a result of modulation of a carrier by adoption of a radio transmission technique; and a plurality of semiconductor chips each including a signal receiving apparatus created therein for receiving the modulated signal;

in the electronic apparatus:

each of the signal receiving apparatus has a frequency conversion section used for carrying out frequency conversion on the modulated signal;

any specific one of the frequency conversion sections is included in a specific one of the semiconductor chips whereas another one of the frequency conversion sections is included in another one of the semiconductor chips; and the specific frequency conversion section carries out the frequency conversion by adoption of a specific frequency conversion method selected from a plurality of frequency conversion methods adoptable for the frequency conversion whereas the other frequency conversion section carries out the frequency conversion by adoption of another frequency conversion method which is selected from the frequency conversion methods adoptable for the frequency conversion as a frequency conversion method different from the specific frequency conversion method.

In accordance with the first and second modes of the present disclosure, frequency conversion can be carried out with a high degree of flexibility.

BRIEF DESCRIPTION OF THE DRAWINGS

FIG. 1 is a diagram showing a top view of a typical configuration of an electronic apparatus according to a first embodiment of the present disclosure;

FIG. 7 is an explanatory table to be referred to in description of characteristics of the injection-locked detection method and the square-law detection method;

FIG. 9 is an explanatory diagram to be referred to in description of selection of a frequency conversion method in accordance with the rate of data conveyed in a modulated signal;

DETAILED DESCRIPTION OF THE PREFERRED EMBODIMENTS

First Embodiment

Figure 2:
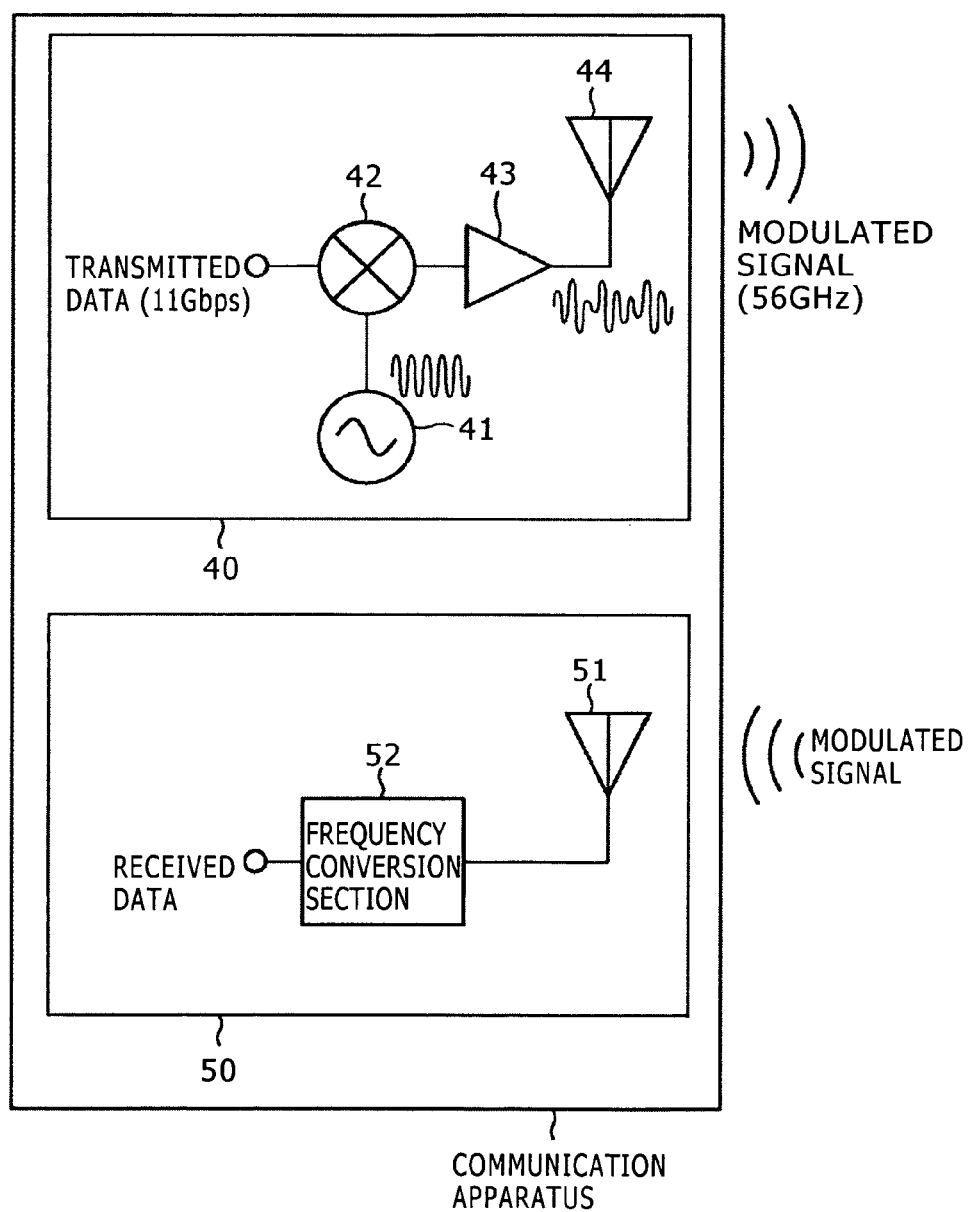
FIG. 2 is a block diagram showing a typical configuration of a communication apparatus.

[Typical Configuration of an Electronic Apparatus According to a First Embodiment]

FIG. 1 is a diagram showing a top view of a typical configuration of an electronic apparatus according to a first embodiment of the present disclosure.

In the electronic apparatus shown in FIG. 1, boards 21 and 22 are accommodated in a case 10 made from typically a metal.

Semiconductor chips 31 and 32 each also referred to as a package are mounted on the board 21 whereas semiconductor chips 33 and 34 are mounted on the board 22.

Each of the semiconductor chips 31 to 34 is a semiconductor chip made from a CMOS (Complementary Metal Oxide Semiconductor) or the like to serve as a chip for carrying out predetermined signal processing in order to perform functions of the electronic device. Each of the semiconductor chips 31 to 34 has a function to carry out radio communications for exchanging data between the chips. The data exchanged between the semiconductor chips 31 to 34 includes data serving as the subject of the signal processing and data obtained as a result of the signal processing.

That is to say, each the semiconductor chips 31 to 34 includes a circuit for carrying out the signal processing determined in advance and a communication section configured to carry out radio communications.

Typically, electric waves output by each the semiconductor chips 31 to 34 are adjusted so that the chip is capable of carrying out a radio communication over only sufficiently short distances such as distances not longer than 1 cm. Thus, the semiconductor chips 31 to 34 as well as the boards 21 and 22 are laid out so that the distance of any two of the semiconductor chips 31 to 34 carrying out radio communications with each other is not longer than the sufficiently short distance.

That is to say, in the configuration shown in FIG. 1, for example, any two of the semiconductor chips 31 to 34 carry out radio communications with each other. Thus, the semiconductor chips 31 to 34 as well as the boards 21 and 22 are laid out so that the distance of any two of the semiconductor chips 31 to 34 carrying out radio communications with each other is not longer than the sufficiently short distance.

It is to be noted that any two of the semiconductor chips 31 to 34 are also capable of exchanging data with each other by carrying out wire communications in addition to the radio communications. If any two of the semiconductor chips 31 to 34 are used for exchanging data with each other by carrying out wire communications, the two of semiconductor chips are electrically connected to each other by a wire.

[Typical Configuration of a Communication Apparatus]

FIG. 2 is a block diagram showing a typical configuration of a communication apparatus configured to employ the semiconductor chips 31 to 34 shown in FIG. 1.

As shown in FIG. 2, the communication apparatus has a signal transmitting apparatus 40 and a signal receiving apparatus 50 which carry out radio communications typically in a milli-wave band.

A milli-wave is an electrical wave having a frequency in a range of 30 to 300 GHz. That is to say, the milli-wave is an electrical wave having a wavelength in a range of 1 to about 10 mm. By making use of electrical waves in the milli-wave band, due to high frequencies, data can be transmitted at a high transmission speed or a high data rate and radio communications or wireless transmissions can be carried out by utilizing small antennas.

It is to be noted that a communication apparatus including semiconductor chips selected among the semiconductor chips 31 to 34 as chips only for carrying out radio transmissions of data can be configured to function only as the signal transmitting apparatus 40. By the same token, a communication apparatus including semiconductor chips selected among the semiconductor chips 31 to 34 as chips only for carrying out operations to receive data by making use of a radio communication method can be configured to function only as the signal receiving apparatus 50.

As shown in the figure, the signal transmitting apparatus 40 has an oscillator 41, a mixer 42, an amplifier 43 and an antenna 44.

The oscillator 41 generates a carrier in the milli-wave band of typically 56 GHz by oscillation and supplies the carrier to the mixer 42.

The mixer 42 receives the carrier from the oscillator 41 and data to be transmitted from a circuit not shown in the figure. A typical example of the data to be transmitted is data having a data rate of up to 11 Gbps.

The mixer 42 mixes the data to be transmitted with the carrier received from the oscillator 41 by multiplying the former by the latter in order to modulate the carrier in accordance with the data to be transmitted. The mixer 42 then supplies a modulated signal obtained as a result of the modulation to the amplifier 43.

In this case, the method for modulating the carrier in accordance with the data to be transmitted is by no means limited to a specific modulation method. In order to make the following explanation easy to understand, however, the ASK (Amplitude Shift Keying) modulation method is adopted, for example.

The amplifier 43 amplifies the modulated signal received from the mixer 42 in order to generate an amplified signal and supplies the amplified signal to the antenna 44.

The antenna 44 is typically configured from a pointing wire of about 1 mm. The antenna 44 transmits the amplified modulated signal generated by the amplifier 43 as electrical waves.

On the other hand, the signal receiving apparatus 50 has an antenna 51 and a frequency conversion section 52.

Much like the antenna 44, the antenna 51 is typically configured from a pointing wire of about 1 mm. The antenna 51 receives a modulated signal from a signal transmitting apparatus on another semiconductor chip. The modulated signal is transmitted by the signal transmitting apparatus as electrical waves. The antenna 51 passes on the modulated signal to the frequency conversion section 52.

The frequency conversion section 52 detects the modulated signal received from the antenna 51 in order to convert the modulated signal into a baseband signal in a process referred to as frequency conversion. The frequency conversion section 52 then acquires data corresponding to the transmitted data from the baseband signal and outputs the acquired data as received data.

In this case, the frequency conversion section 52 is capable of carrying out the frequency conversion by adopting a method selected from a plurality of frequency conversion methods adoptable in the frequency conversion. That is to say, the frequency conversion section 52 is capable of selecting a method from a plurality of frequency conversion methods and converting the modulated signal received from the antenna 51 into a baseband signal by adoption of the selected frequency conversion method.

The frequency conversion methods adoptable in the frequency conversion for detecting the modulated signal typically include a synchronous detection method, a square-law detection method and an envelope detection. In addition, if the modulated signal is detected by adoption of the synchronous detection method, a reproduced carrier used in the detection of the modulated signal is generated by making use of a method utilizing a PLL technique, an injection-locked technique or another technique.

As described above, the frequency conversion section 52 selects a method from a plurality of frequency conversion methods and converts the modulated signal. Thus, the frequency conversion section 52 is capable of carrying out the frequency conversion with a high degree of flexibility.

It is to be noted that the antennas 44 and 51 can be implemented by one antenna.

[Typical Configuration of the Frequency Conversion Section 52]

Figure 3:
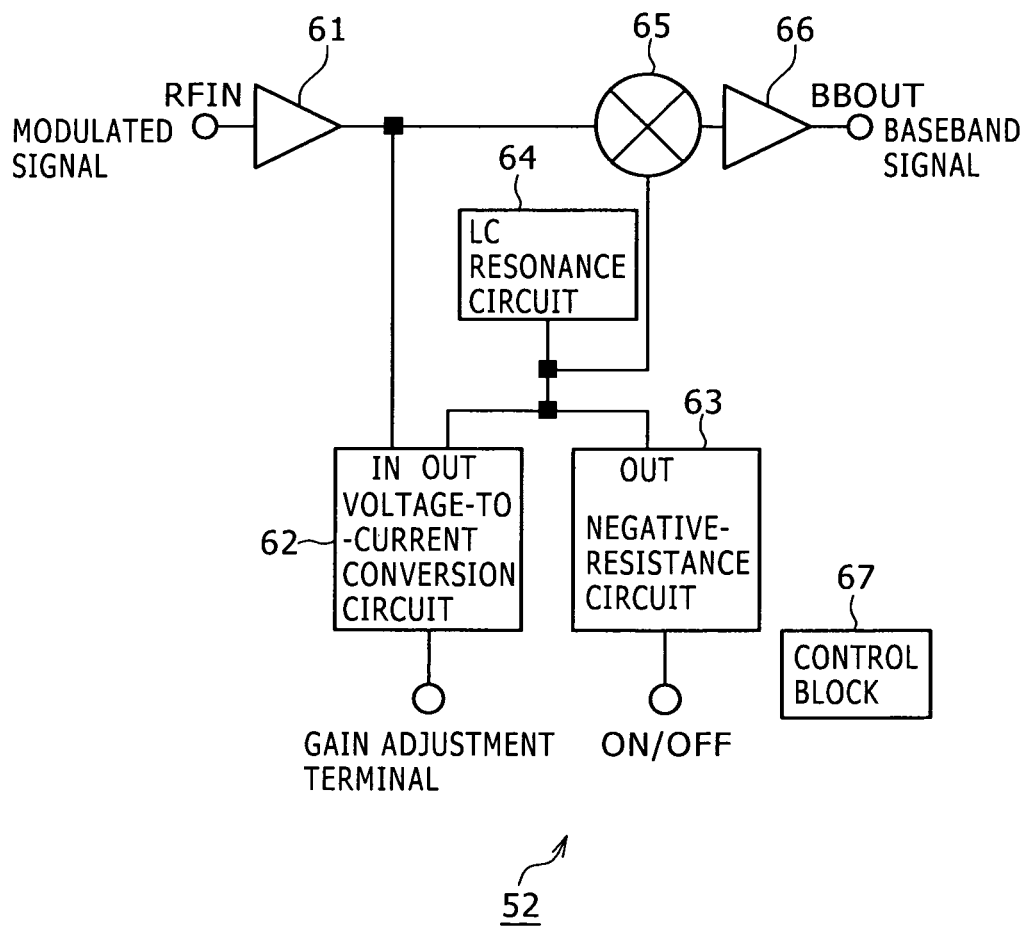
FIG. 3 is a block diagram showing a typical configuration of a frequency conversion section.

FIG. 3 is a block diagram showing a typical configuration of the frequency conversion section 52 of the signal receiving apparatus 50 employed in the communication apparatus shown in FIG. 2.

The frequency conversion section 52 is capable of selecting any one of a plurality of frequency conversion methods including a square-law detection method and a synchronous detection method. The square-law detection method is a method for carrying out square-law detection to detect a modulated signal. On the other hand, the synchronous detection method is a method for carrying out synchronous detection to detect a modulated signal. In the synchronous detection method, a reproduced carrier is generated by adopting a PLL synchronous detection method or an injection-locked detection method. The PLL synchronous detection method is method making use of a PLL in the generation of the reproduced carrier. On the other hand, the injection-locked detection method is a method making use of an injection-locked technique in the generation of the reproduced carrier.

As described above, in accordance with the PLL synchronous detection method, a PLL is used in the generation of the reproduced carrier. It is thus possible to generate a highly stable reproduced carrier without regard to the stability of the transmission-line characteristic which is the characteristic of a transmission line for transmitting electrical waves.

In accordance with the PLL synchronous detection method, however, it is necessary to provide a PLL in the frequency conversion section 52. Thus, the size of the circuit of the frequency conversion section 52 and, hence, the size of the circuit of the signal receiving apparatus 50 employing the frequency conversion section 52 as shown in FIG. 2 is large.

In accordance with the injection-locked detection method, on the other hand, the modulated signal having an RF (Radio Frequency) is used as an injected signal in the generation of the reproduced carrier. Thus, in order to generate a highly stable reproduced carrier, it is desirable to make use of a transmission line having a stable characteristic.

By the way, the semiconductor chips 31 to 34 shown in FIG. 1 are fixed in the case 10. Thus, any two semiconductor chips included in the semiconductor chips 31 to 34 to serve as chips for carrying out a radio communication have a fixed positional relation.

In addition, the semiconductor chips 31 to 34 shown in FIG. 1 are fixed in the case 10 which is made from a metal. Thus, there are no interferences from electrical waves external to the case 10.

Accordingly, the communication environment of the semiconductor chips 31 to 34 is stable. That is to say, the characteristic of the transmission line for the semiconductor chips 31 to 34 is stable. By adopting the injection-locked detection method in such a stable communication environment, a highly stable reproduced carrier can be generated.

For the reason described above, in this embodiment, the PLL synchronous detection method is not required as one of the frequency conversion methods that can be adopted by the frequency conversion section 52 to carry out the frequency conversion. Thus, it is necessary to adopt only the injection-locked detection method which requires a simple circuit configuration.

By the way, in accordance with the injection-locked detection method, the modulated signal having an RF (Radio Frequency) signal is injected into an oscillator also referred to as an oscillation circuit as an injected signal so that the oscillator generates a reproduced carrier synchronous with the carrier of the modulated signal serving as the injected signal. In addition, in accordance with the injection-locked detection method, a state of being synchronous (or locked) with the modulated signal requires that the modulated signal be the modulated signal of data having a high rate to a certain degree. If the modulated signal is the modulated signal of data having a low rate, however, it is difficult to establish and sustain the state of being synchronous (or locked) with the modulated signal. Thus, the modulated signal cannot be detected.

In accordance with the square-law detection method, on the other hand, the modulated signal is squared in order to convert the modulated signal into a baseband signal. Thus, even if the modulated signal is the modulated signal of data having a low rate, the modulated signal can be detected.

Thus, in this embodiment, in addition to the injection-locked detection method, the square-law detection method can also be selected as an adopted detection method from a plurality of frequency conversion methods that can be adopted by the frequency conversion section 52 to carry out the frequency conversion.

Accordingly, as described above, in this embodiment, the injection-locked detection method or the square-law detection method can be selected as an adopted detection method from a plurality of frequency conversion methods that can be adopted by the frequency conversion section 52 to carry out the frequency conversion. By considering a tolerated circuit scale, a tolerated manufacturing cost, a tolerated communication environment and other tolerated factors, however, the PLL synchronous detection method or another detection method can also be selected.

Let the injection-locked detection method and the square-law detection method be methods that can be each selected as an adopted detection method from the frequency conversion methods. In this case, for the modulated signal of data having a high rate as is the case with the data of an image or the like, the injection-locked detection method is selected in order to allow the modulated signal to be detected properly. For the modulated signal of data having a low rate as is the case with the control data or the like, on the other hand, the square-law detection method is selected in order to allow the modulated signal to be detected properly.

In the case of a frequency conversion section 52 capable of selecting any one of a plurality of frequency conversion methods, there is provided a technique for configuring the frequency conversion section 52. In accordance with this configuration technique, each circuit employed in the frequency conversion section 52 to serve as a circuit for carrying out the frequency conversion by adoption of one of the frequency conversion methods is constructed in a semiconductor chip provided for the adopted frequency conversion method.

For example, as described above, let the injection-locked detection method and the square-law detection method be methods that can each be selected as an adopted detection method from the frequency conversion methods. In this case, there is provided a construction technique by which a first circuit for carrying out the frequency conversion by adoption of the injection-locked detection method and a second circuit for carrying out the frequency conversion by adoption of the square-law detection method are constructed independently of each other in any of the semiconductor chips 31 to 34. The modulated signal is then supplied to the first circuit or the second circuit by switching the circuits from one to another.

If the first circuit for carrying out the frequency conversion by adoption of the injection-locked detection method and the second circuit for carrying out the frequency conversion by adoption of the square-law detection method are constructed independently of each other in the semiconductor chip 31 for example and a switch is provided for switching the circuit for receiving the modulated signal from the first circuit to the second circuit or vice versa, however, the area occupied by the frequency conversion section 52 in the semiconductor chip 31 will increase proportionally to the number of circuits each used for carrying out the frequency conversion. In addition, if the modulated signal of the milli-wave band is supplied to any one of the circuits each used for carrying out the frequency conversion by way of the switch, there is concern that the characteristic of the modulated signal may deteriorate.

In order to solve the above problems, the frequency conversion section 52 shown in FIG. 3 is designed into a configuration in which the first circuit for carrying out the frequency conversion by adoption of the injection-locked detection method and the second circuit for carrying out the frequency conversion by adoption of the square-law detection method are integrated to form the so-called single circuit.

That is to say, the frequency conversion section 52 shown in FIG. 3 is designed into a configuration having an RF (Radio Frequency) amplifier 61, a voltage-to-current conversion circuit 62, a negative-resistance circuit 63, an LC resonance circuit 64, a mixer 65 a BB (Baseband) amplifier 66 and a control block 67.

The RF amplifier 61 receives the modulated signal from the antenna 51 employed in the signal receiving apparatus 50 of the communication apparatus shown in FIG. 2.

The RF amplifier 61 amplifies the modulated signal received from the antenna 51 as an RF signal in order to generate an amplified modulated signal and supplies the amplified modulated signal to an input terminal IN of the voltage-to-current conversion circuit 62 and the mixer 65.

The voltage-to-current conversion circuit 62 carries out voltage-to-current conversion on the modulated signal received at the input terminal IN from the RF amplifier 61 and generates an output signal, which is a current signal obtained as the result of the voltage-to-current conversion, and outputs the signal from an output terminal OUT.

It is to be noted that the voltage-to-current conversion circuit 62 is capable of adjusting the gain of the voltage-to-current conversion in accordance with control carried out by the control block 67.

Seen from a terminal OUT of the negative-resistance circuit 63, the negative-resistance circuit 63 functions as a resistor having a negative resistance and is capable of turning the function of the negative-resistance resistor on and off. The terminal OUT of the negative-resistance circuit 63 is connected to the LC resonance circuit 64.

It is to be noted that the operation to turning the negative-resistance function of the negative-resistance circuit 63 on and off is carried out in accordance with control carried out by the control block 67.

The voltage-to-current conversion circuit 62 supplies the current signal generated thereby as the output signal to the LC resonance circuit 64 by way of a connection point between the negative-resistance circuit 63 and the LC resonance circuit 64.

In addition, the connection point between the negative-resistance circuit 63 and the LC resonance circuit 64 is also connected to the mixer 65. Thus, a signal appearing on the connection point between the negative-resistance circuit 63 and the LC resonance circuit 64 is supplied to the mixer 65. In the following description, the signal appearing on the connection point between the negative-resistance circuit 63 and the LC resonance circuit 64 is also referred to as a connection-point signal.

The mixer 65 mixes the modulated signal received from the RF amplifier 61 with the connection-point signal received from the connection point between the negative-resistance circuit 63 and the LC resonance circuit 64 by multiplying the former by the latter in order to convert the modulated signal into a baseband signal and supplies the baseband signal to the BB amplifier 66.

The BB amplifier 66 amplifies the baseband signal received from the mixer 65 and outputs the amplified baseband signal.

An LPF (Low Pass Filter) not shown in the figure filters the baseband signal output by the BB amplifier 66 in order to extract (or acquire) a frequency component corresponding to the transmitted data.

It is to be noted that, with the negative-resistance function of the negative-resistance circuit 63 turned on, the negative-resistance circuit 63 and the LC resonance circuit 64 form an oscillation circuit also referred to as an oscillator.

[Operations of the Frequency Conversion Section 52]

Figure 4:
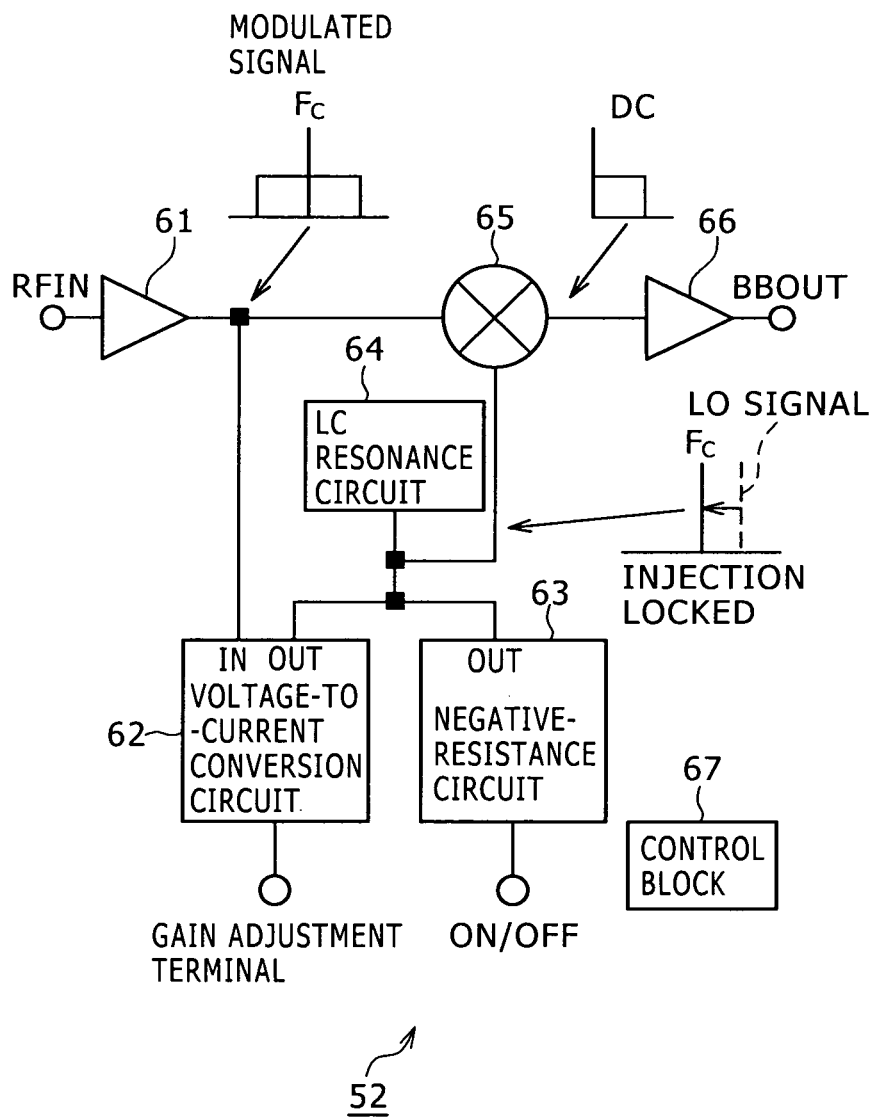
FIG. 4 is an explanatory diagram showing the frequency conversion section for carrying out operations of frequency conversion by adoption of an injection-locked detection method.

FIG. 4 is an explanatory diagram showing the frequency conversion section 52 for carrying out operations of the frequency conversion by adoption of the injection-locked detection method.

When the frequency conversion section 52 carries out operations of the frequency conversion by adoption of the injection-locked detection method, the control block 67 turns on the negative-resistance function of the negative-resistance circuit 63 so that the negative-resistance circuit 63 and the LC resonance circuit 64 form an oscillation circuit.

Then, the output signal generated by the voltage-to-current conversion circuit 62 as the result of the voltage-to-current conversion carried out on the modulated signal received by the voltage-to-current conversion circuit 62 from the RF amplifier 61 is supplied to the oscillation circuit formed by the negative-resistance circuit 63 and the LC resonance circuit 64 as an injected signal injected into the oscillation circuit in the so-called current injection.

The oscillation circuit formed by the negative-resistance circuit 63 and the LC resonance circuit 64 oscillates the output signal received from the voltage-to-current conversion circuit 62 in a kind of so-called oscillation. An oscillated signal obtained as the result of the oscillation carried out by the oscillation circuit is supplied to the mixer 65 as a reproduced carrier. In the following description, the oscillated signal is also referred to as an LO (Local Oscillator) signal.

The LC resonance circuit 64 is capable of adjusting the resonance frequency. The LC resonance circuit 64 adjusts the resonance frequency to a frequency close to the frequency $F_c$ of the carrier of the modulated signal so that the LO signal oscillated by the oscillation circuit formed by the negative-resistance circuit 63 and the LC resonance circuit 64 is synchronous (or injection-locked) with the output signal serving as the injected signal, that is, synchronous (or injection-locked) with the carrier of the modulated signal.

The mixer 65 mixes the modulated signal received from the RF amplifier 61 with the reproduced carrier which is the LO signal oscillated by the oscillation circuit formed by the negative-resistance circuit 63 and the LC resonance circuit 64 in order to carry out synchronous detection on the modulated signal. The mixer 65 supplies the baseband signal obtained as a result of the synchronous detection to the BB amplifier 66.

It is to be noted that the resonance frequency of the LC resonance circuit 64 is adjusted in accordance with control carried out by the control block 67.

In addition, in order to make the LO signal oscillated by the oscillation circuit formed by the negative-resistance circuit 63 and the LC resonance circuit 64 synchronous (or injection-locked) with the output signal or the carrier of the modulated signal, in some cases, it is necessary to adjust the level of the output signal generated by the voltage-to-current conversion circuit 62 to serve as the injected signal. The level of the output signal generated by the voltage-to-current conversion circuit 62 can be adjusted by properly controlling the gain of the voltage-to-current conversion carried out by the voltage-to-current conversion circuit 62 in accordance with control carried out by the control block 67.

Figure 5:
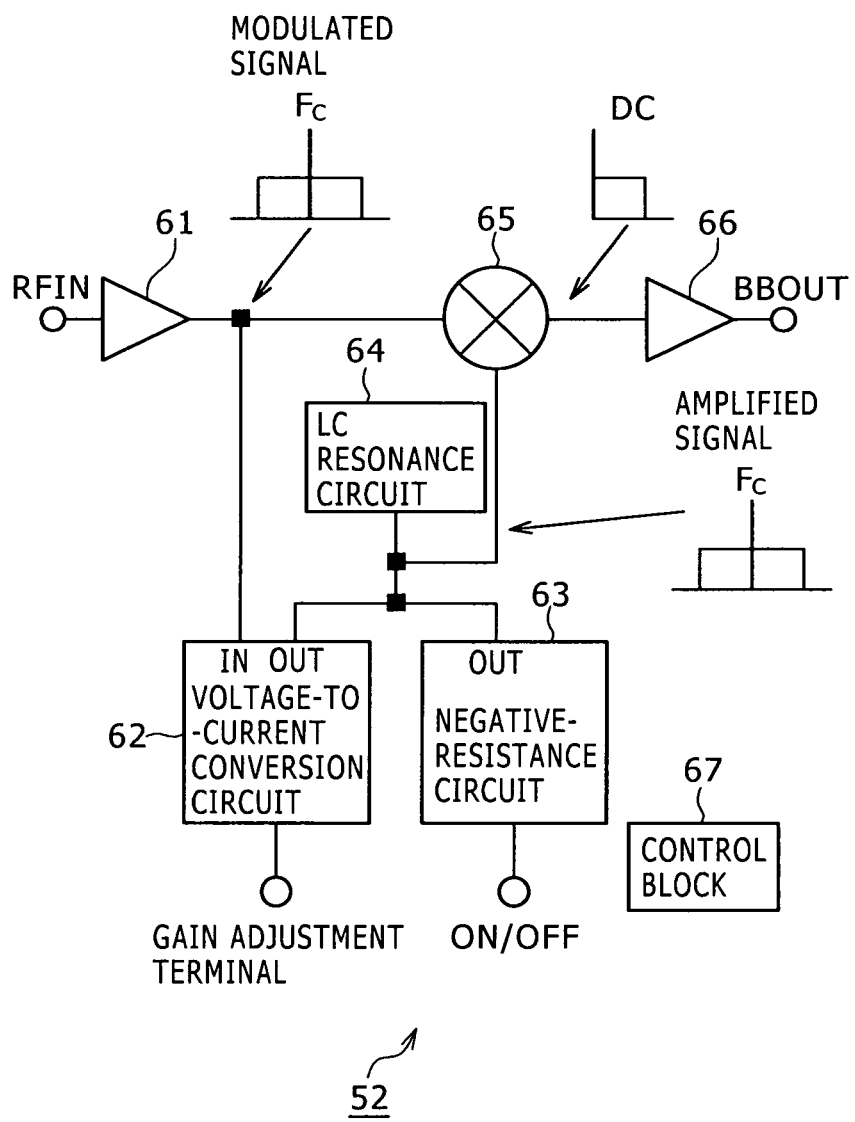
FIG. 5 is an explanatory diagram showing the frequency conversion section for carrying out operations of frequency conversion by adoption of a square-law detection method.

FIG. 5 is an explanatory diagram showing the frequency conversion section 52 for carrying out operations of the frequency conversion by adoption of the square-law detection method.

When the frequency conversion section 52 carries out operations of the frequency conversion by adoption of the square-law detection method, the control block 67 turns off the negative-resistance function of the negative-resistance circuit 63 so that the voltage-to-current conversion circuit 62 and the LC resonance circuit 64 form an amplifier having the LC resonance circuit 64 as the load thereof.

Then, the amplifier formed by the voltage-to-current conversion circuit 62 and the LC resonance circuit 64 amplifies the modulated signal generated by the RF amplifier 61 and outputs an amplified signal obtained as a result of the amplification of the modulated signal to the mixer 65.

In order to make the explanation simple, the amplification gain of the amplifier formed by the voltage-to-current conversion circuit 62 and the LC resonance circuit 64 is assumed to have a typical value of 1. In this case, the amplified signal supplied to the mixer 65 is equal to the modulated signal.

The mixer 65 mixes the modulated signal received from the RF amplifier 61 with the amplified signal received from the amplifier formed by the voltage-to-current conversion circuit 62 and the LC resonance circuit 64 by multiplying the former by the latter. That is to say, the mixer 65 takes the square of the modulated signal. The mixer 65 then supplies the product obtained as a result of the multiplication to the BB amplifier 66.

It is to be noted that the control block 67 adjusts the gain of the voltage-to-current conversion carried out by the voltage-to-current conversion circuit 62. The gain is adjusted so that the amplifier formed by the voltage-to-current conversion circuit 62 and the LC resonance circuit 64 is capable of amplifying the modulated signal to a level proper for the square-law detection method.

[Voltage-to-Current Conversion Circuit 62, Negative-Resistance Circuit 63 and LC Resonance Circuit 64]

Figure 6:
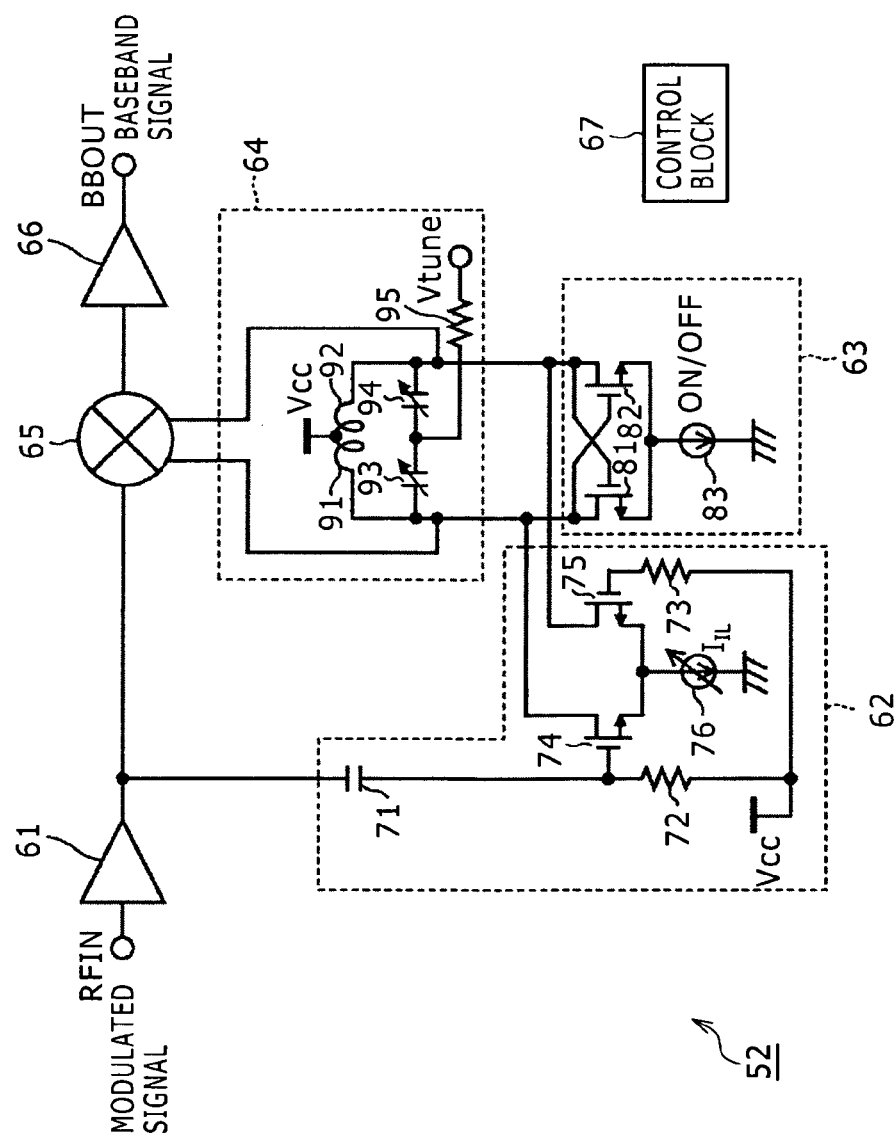
FIG. 6 is a diagram showing typical configurations of a voltage-to-current conversion circuit, a negative-resistance circuit and an LC resonance circuit.

FIG. 6 is a diagram showing typical configurations of the voltage-to-current conversion circuit 62, the negative-resistance circuit 63 and the LC resonance circuit 64.

As shown in the figure, the voltage-to-current conversion circuit 62 is configured as a differential amplifier employing a pair of FETs (Field-Effect Transistors) 74 and 75.

To put it in detail, the voltage-to-current conversion circuit 62 shown in FIG. 6 has a capacitor 71, resistors 72 and 73, the FETs 74 and 75 as well as a constant-current source 76.

A specific one of the two ends of the capacitor 71 is connected to the output terminal of the RF amplifier 61 whereas the other one of the two ends of the capacitor 71 is connected to a specific one of the two ends of the resistor 72.

The other one of the two ends of the resistor 72 is connected to a specific one of the two ends of the resistor 73. The connection point between the resistors 72 and 73 is connected to a power supply $V_{CC}$.

The gate of the FET 74 is connected to the connection point between the capacitor 71 and the resistor 72 whereas the gate of the FET 75 is connected to the other one of the two ends of the resistor 73.

In addition, the sources of the FETs 74 and 75 are connected to each other and the connection point between the sources is connected to the ground through the constant-current source 76.

It is to be noted that the drains of the FETs 74 and 75 are connected to the mixer 65. Between these drains of the FETs 74 and 75 connected to the mixer 65, the LO signal and the modulated signal appear as the reproduced carrier and the amplified signal respectively.

In the voltage-to-current conversion circuit 62 configured as described above, the modulated signal generated by the RF amplifier 61 is supplied to the gate of the FET 74 by way of the capacitor 71 for removing the DC component of the modulated signal.

The power supply $V_{CC}$ applies a bias to the gate of the FET 74 by way of the resistor 72 and a bias to the gate of the FET 75 by way of the resistor 73.

In addition, the gate of the FET 74 is provided with the modulated signal from which the DC component has been removed by the capacitor 71.

The FETs 74 and 75 form the differential amplifier cited above. Between the drain and gate of the FET 74 and between the drain and gate of the FET 75, a current representing the modulated signal flows. This current is the result of the voltage-to-current conversion carried out by the voltage-to-current conversion circuit 62 to convert the modulated signal from a voltage into a current.

It is to be noted that the gain of the voltage-to-current conversion carried out by the voltage-to-current conversion circuit 62 is adjusted by adjusting a current $I_{IL}$ flowing through the constant-current source 76 and the current $I_{IL}$, is adjusted in accordance with control carried out by the control block 67.

The negative-resistance circuit 63 is configured as a pair of FETs 81 and 82 connected to each other to form a cross-coupling connection.

To put it in detail, as shown in FIG. 6, the negative-resistance circuit 63 has the FETs 81 and 82 as well as a constant-current source 83.

As described above, the FETs 81 and 82 are connected to each other to form a cross-coupling connection.

To put it in detail, the gate of the FET 81 is connected to the drain of the FET 82 whereas the drain of the FET 81 is connected to the gate of the FET 82.

In addition, the sources of the FETs 81 and 82 are connected to each other and the connection point between the sources is connected to the ground through the constant-current source 83.

The drain of the FET 81 is connected to a connection point between the drain of the FET 74 and the mixer 65 whereas the drain of the FET 82 is connected to a connection point between the drain of the FET 75 and the mixer 65.

When the constant-current source 83 is turned on, the negative-resistance circuit 63 configured as described above functions as a negative-resistance resistor. When the constant-current source 83 is turned off, on the other hand, the negative-resistance circuit 63 turns off the function of the negative-resistance resistor.

As shown in FIG. 6, the LC resonance circuit 64 has coils 91 and 92, capacitors 93 and 94 as well as a resistor 95.

A specific one of the two ends of the coil 91 is connected to a specific one of the two ends of the coil 92 and the connection point between these specific ends of the coils 91 and 92 is connected to the power supply $V_{CC}$.

The other one of the two ends of the coil 91 is connected to a specific one of the two ends of the capacitor 93 having a variable capacitance. On the other hand, the other one of the two ends of the coil 92 is connected to a specific one of the two ends of the capacitor 94 also having a variable capacitance.

The other one of the two ends of the capacitor 93 is connected to the other one of the two ends of the capacitor 94 and the connection point between these other ends is connected to a terminal Vtune through the resistor 95.

In addition, the connection point between the coil 91 and the capacitor 93 is connected to the connection point between the drain of the FET 74 employed in the voltage-to-current conversion circuit 62 and the mixer 65 as well as the connection point between the drain of the FET 81 employed in the negative-resistance circuit 63 and the mixer 65.

By the same token, the connection point between the coil 92 and the capacitor 94 is connected to the connection point between the drain of the FET 75 employed in the voltage-to-current conversion circuit 62 and the mixer 65 as well as the connection point between the drain of the FET 82 employed in the negative-resistance circuit 63 and the mixer 65.

It is to be noted that the coils 91 and 92 can also be configured as one coil.

A bias applied to the connection point between the capacitors 93 and 94 from the terminal Vtune through the resistor 95 in the LC resonance circuit 64 configured as described above can be adjusted in order to adjust the resonance frequency of the LC resonance circuit 64. The control block 67 is capable of adjusting the bias applied to the connection point between the capacitors 93 and 94 from the terminal Vtune through the resistor 95.

When the frequency conversion section 52 carries out the frequency conversion by adoption of the injection-locked detection method, the frequency conversion section 52 turns on the constant-current source 83 of the negative-resistance circuit 63 in order to turn on the function of the negative resistance of the negative-resistance circuit 63.

When the frequency conversion section 52 turns on the function of the negative resistance of the negative-resistance circuit 63, a current flows between the negative-resistance circuit 63 and the LC resonance circuit 64 and, in this state, an oscillation circuit is formed by the negative-resistance circuit 63 and the LC resonance circuit 64.

In the mean time, the voltage-to-current conversion circuit 62 converts the modulated signal received from the RF amplifier 61 from a voltage into a current representing the modulated signal. This current representing the modulated signal flows to the drains of the FETs 74 and 75 as an output signal.

The current representing the modulated signal and serving as the output signal is injected as an injected signal from the drains of the FETs 74 and 75 into the oscillation circuit formed by the negative-resistance circuit 63 and the LC resonance circuit 64.

The oscillation circuit oscillates the output signal received from the voltage-to-current conversion circuit 62 in a kind of so-called oscillation. An oscillated signal obtained as the result of the oscillation is supplied to the mixer 65 as a reproduced carrier. As described before, the oscillated signal is also referred to as an LO signal.

The control block 67 adjusts the bias applied to the connection point between the capacitors 93 and 94 from the terminal Vtune through the resistor 95 in order to set the resonance frequency of the LC resonance circuit 64 to a value close to the frequency of the carrier of the modulated signal. That is to say, the control block 67 adjusts the bias in order to set the resonance frequency of the LC resonance circuit 64 to a value in a synchronization pull-in range.

By adjusting the resonance frequency of the LC resonance circuit 64 to a value close to the frequency of the carrier of the modulated signal, the LO signal oscillated by the oscillation circuit formed by the negative-resistance circuit 63 and the LC resonance circuit 64 can be synchronized (or locked) to the output signal used as the injected signal. That is to say, by adjusting the resonance frequency of the LC resonance circuit 64, the LO signal can be synchronized (or locked) to the carrier of the modulated signal.

It is to be noted that the control block 67 adjusts not only the bias applied to the connection point between the capacitors 93 and 94 in order to adjust the resonance frequency of the LC resonance circuit 64, but also the current $I_{IL}$ flowing through the constant-current source 76 in order to adjust the gain of the frequency conversion carried out by the voltage-to-current conversion circuit 62.

That is to say, in the oscillation circuit formed by the negative-resistance circuit 63 and the LC resonance circuit 64, in order to synchronize the LO signal to the modulated signal (or the output signal), it is necessary to adjust the resonance frequency of the LC resonance circuit 64 and adjust the level of the output signal generated by the voltage-to-current conversion circuit 62 as the injected signal by adjusting the gain of the frequency conversion carried out by the voltage-to-current conversion circuit 62 to a proper value. It is the control block 67 that adjusts the resonance frequency of the LC resonance circuit 64 and the gain of the frequency conversion.

If the frequency conversion section 52 carries out the frequency conversion by adoption of the square-law detection method, on the other hand, the control block 67 turns off the constant-current source 83 employed in the negative-resistance circuit 63 in order to deactivate the negative-resistance function of the negative-resistance circuit 63.

If the control block 67 deactivates the negative-resistance function of the negative-resistance circuit 63, a current no longer flows to the negative-resistance circuit 63 and; in this state, the voltage-to-current conversion circuit 62 and the LC resonance circuit 64 forms an amplifier.

The amplifier formed by the voltage-to-current conversion circuit 62 and the LC resonance circuit 64 amplifies the modulated signal generated by the RF amplifier 61 and supplies an amplified signal obtained as the result of the amplification to the mixer 65.

It is to be noted that the control block 67 adjusts the current $I_{IL}$ flowing through the constant-current source 76 in order to adjust the gain of the frequency conversion carried out by the voltage-to-current conversion circuit 62 so that the amplifier formed by the voltage-to-current conversion circuit 62 and the LC resonance circuit 64 amplifies the modulated signal generated by the RF amplifier 61 to an amplified signal proper for the square-law detection method.

[Characteristics of the Injection-Locked Detection Method and the Square-Law Detection Method]

FIG. 7 is an explanatory table referred to in the following description of characteristics of the injection-locked detection method and the square-law detection method which are each adopted as a frequency conversion method in the frequency conversion carried out by the frequency conversion section 52.

In comparison with the square-law detection method, the injection-locked detection method provides a relatively broad signal receiving range and a relatively broad frequency band. The signal receiving range is defined as the range of levels of the modulated signal which can be subjected to the frequency conversion. In the case of the square-law detection method, however, the gain has a square-law characteristic. Thus, in comparison with the injection-locked detection method, the square-law detection method provides a relatively narrow signal receiving range and a relatively narrow frequency band. The signal receiving range for the square-law detection method is also defined as the range of levels of the modulated signal which can be subjected to the frequency conversion.

In addition, in the case of the injection-locked detection method, for a modulated signal conveying data of a low rate, the synchronization of the LO signal to the modulated signal is unstable. It is thus difficult to carry out the frequency conversion. In the case of the square-law detection method, however, there is no case in which it is difficult to carry out the frequency conversion on a modulated signal conveying data of a low rate due to the instability of the synchronization of the LO signal to the modulated signal.

Thus, for the low-rate transmission and the frequency conversion of a modulated signal conveying data of a low rate, the square-law detection method is more appropriate than the injection-locked detection method.

On top of that, in the case of the injection-locked detection method, it is necessary to carry out LO-frequency control which is control of the frequency of the LO signal serving as the reproduced carrier. That is to say, it is necessary to control the resonance frequency of the LC resonance circuit 64. In the case of the square-law detection method, however, it is not necessary to carry out LO-frequency control because the reproduced carrier is not generated.

In addition, in the case of the injection-locked detection method, a transmitted-data sequence can be selected or separated from a baseband signal obtained as a result of the frequency conversion carried out on a frequency-allocation modulated signal to be described later. The selection (or separation) of a transmitted-data sequence from a baseband signal is referred to as signal selection in the BB (Baseband) band. In the case of the square-law detection method, however, it is difficult to select such a transmitted-data sequence from the baseband signal.

Figure 8A:
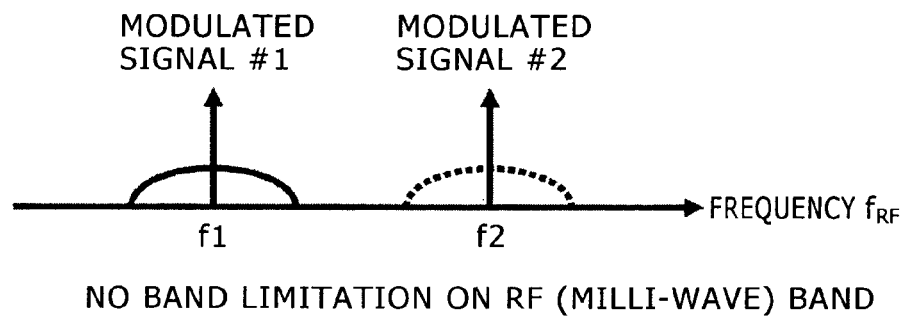
FIGS. 8A to 8C are a plurality of explanatory diagrams to be referred to in description of selection of a data sequence from a baseband signal.
Figure 8B:
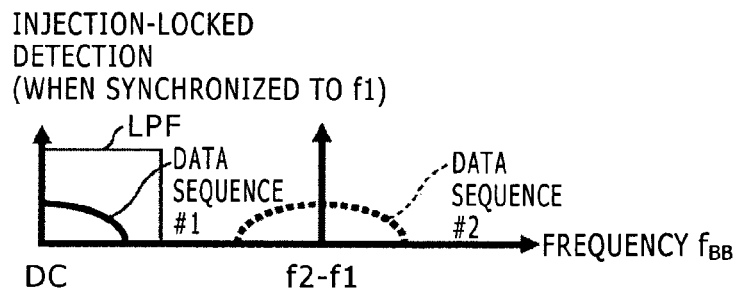
Figure 8C:
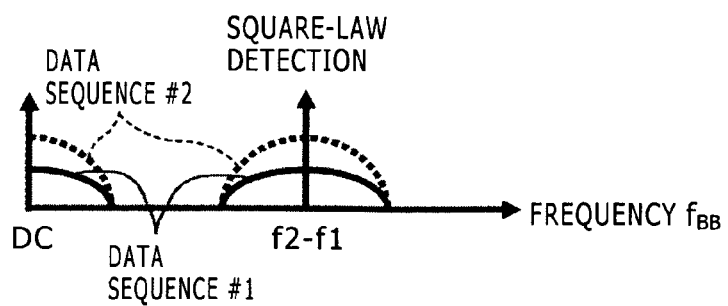

FIGS. 8A to 8C are a plurality of explanatory diagrams referred to in the following description of the selection of a transmitted-data sequence from a baseband signal.

To be more specific, FIG. 8A is a diagram showing spectra of frequency-allocation modulated signals #1 and #2 obtained by allocating different frequencies to the carriers of modulated signals #1 and #2.

Modulated signal #1 shown in FIG. 8A is a signal obtained as a result of modulating a carrier with a frequency f1 by making use of data sequence #1 with a certain data rate. On the other hand, modulated signal #2 shown in FIG. 8A is a signal obtained as a result of modulating another carrier with a frequency f2 higher than the frequency f1 by making use of data sequence #2 with a certain data rate.

The frequencies f1 and f2 of the carriers are so selected that the frequency band of modulated signal #1 does not overlap the frequency band of modulated signal #2. Thus, modulated signals #1 and #2 can be transmitted at the same time.

That is to say, as an example, let any two of the semiconductor chips 31 to 34 be selected as first and second semiconductor chips respectively. In addition, also let the first semiconductor chip transmit modulated signal #1 to the second semiconductor chip whereas the second semiconductor chip transmit modulated signal #2 to the first semiconductor chip. In this case, the first semiconductor chip is capable of transmitting modulated signal #1 to the second semiconductor chip whereas the second semiconductor chip is capable of transmitting modulated signal #2 to the first semiconductor chip at the same time.

As another example, let any three of the semiconductor chips 31 to 34 be selected as first, second and third semiconductor chips respectively. In addition, also let the first semiconductor chip transmit modulated signal #1 to the second semiconductor chip and modulated signal #2 to the third semiconductor chip. In this case, the first semiconductor chip is capable of transmitting modulated signal #1 to the second semiconductor chip and modulated signal #2 to the third semiconductor chip at the same time.

FIG. 8B is a diagram showing spectra of two baseband signals obtained as a result of the frequency conversion carried out on modulated signals #1 and #2 by adoption of the injection-locked detection method.

In accordance with the injection-locked detection method, as an example, let the LO signal used as the reproduced carrier be synchronized to modulated signal #1. In this case, the frequency components of modulated signal #1 are spread in the neighborhood of the DC (Direct Current) component whereas the frequency components of modulated signal #2 are spread over a frequency band with the center thereof coinciding with a frequency of (f2−f1).

Thus, data sequence #1 can be extracted by making use of an LPF for filtering the baseband signal.

In addition, in accordance with the injection-locked detection method, as another example, let the LO signal used as the reproduced carrier be synchronized to modulated signal #2. In this case, the frequency components of modulated signal #2 are spread in the neighborhood of the DC (Direct Current) component. Thus, data sequence #2 can also be extracted by making use of an LPF for filtering the baseband signal.

As described above, in accordance with the injection-locked detection method, data sequences #1 and #2 can be selected or separated from baseband signals obtained as a result of the frequency conversion carried out on frequency-allocation modulated signals #1 and #2.

FIG. 8C is a diagram showing spectra of baseband signals obtained as a result of the frequency conversion carried out on frequency-allocation modulated signals #1 and #2 respectively by adoption of the square-law detection method.

In accordance with the square-law detection method, the entire portions of modulated signals #1 and #2 are squared to generate baseband signals. Thus, in the baseband signals, the frequency components of both data sequences #1 and #2 are spread in the neighborhood of the DC (Direct Current) component and over a frequency band with the center thereof coinciding with a frequency of (f2−f1).

As a result, in the baseband signals obtained as a result of adoption of the square-law detection method, the frequency components of data sequence #1 overlap the frequency components of data sequence #2. Accordingly, in accordance with the square-law detection method, it is difficult to select data sequences #1 and #2 from baseband signals obtained as a result of frequency conversion carried out on frequency-allocation modulated signals #1 and #2.

As described above, in the case of the injection-locked detection method, it is possible to select data sequences from baseband signals obtained as a result of frequency conversion carried out on frequency-allocation modulated signals. In the case of the square-law detection method, however, it is difficult to select data sequences and from baseband signals obtained as a result of frequency conversion carried out on frequency-allocation modulated signals.

[Selection of a Frequency Conversion Method]

FIG. 9 is an explanatory diagram referred to in the following description of selection of a frequency conversion method in accordance with the rate of data conveyed by a modulated signal.

Since the injection-locked detection method and the square-law detection method each have characteristics like the ones explained above by referring to FIGS. 7 and 8A to 8C, by taking the characteristics into configuration, the frequency conversion section 52 is capable of selecting either the injection-locked detection method or the square-law detection method.

The frequency conversion section 52 selects either the injection-locked detection method or the square-law detection method in accordance with control carried out by the control block 67.

FIG. 9 is an explanatory diagram referred to in the following description of a process to select either the injection-locked detection method or the square-law detection method in accordance with the rate of data conveyed by the modulated signal.

The control block 67 controls the process to select either the injection-locked detection method or the square-law detection method in accordance with the rate of data conveyed in the modulated signal. If the rate of data conveyed in the modulated signal received by the frequency conversion section 52 is high as is the case with the data of an image or the like for example, the control block 67 selects the injection-locked detection method. If the rate of data conveyed in the modulated signal received by the frequency conversion section 52 is low as is the case with the control data or the like, on the other hand, the control block 67 selects the square-law detection method.

Through a wire communication line shown in none of the figures, the signal transmitting apparatus 40 employed in the communication apparatus as shown in FIG. 2 to serve as an apparatus for transmitting a modulated signal typically provides the control block 67 with information indicating whether the modulated signal conveys transmitted data of a high or low rate.

In the configuration shown in FIG. 9, with a certain timing, the semiconductor chip 31 transmits a modulated signal conveying data of a low rate such as control data to each of the semiconductor chips 32 to 34.

In addition, in the configuration shown in FIG. 9, with another timing, the semiconductor chip 31 transmits a modulated signal conveying data of a high rate such as image data to the semiconductor chip 32 whereas the semiconductor chip 33 also transmits a modulated signal conveying data of a high rate to the semiconductor chip 34.

When the semiconductor chip 31 transmits a modulated signal conveying data of a low rate to each of the semiconductor chips 32 to 34, the control block 67 included in each of the semiconductor chips 32 to 34 receiving the modulated signal conveying data of a low rate selects the square-law detection method.

In addition, when the semiconductor chip 31 transmits a modulated signal conveying data of a high rate to the semiconductor chip 32 whereas the semiconductor chip 33 transmits a modulated signal conveying data of a high rate to the semiconductor chip 34, the control block 67 included in each of the semiconductor chips 32 and 34 receiving the modulated signal conveying data of a high rate selects the injection-locked detection method.

Figure 10:
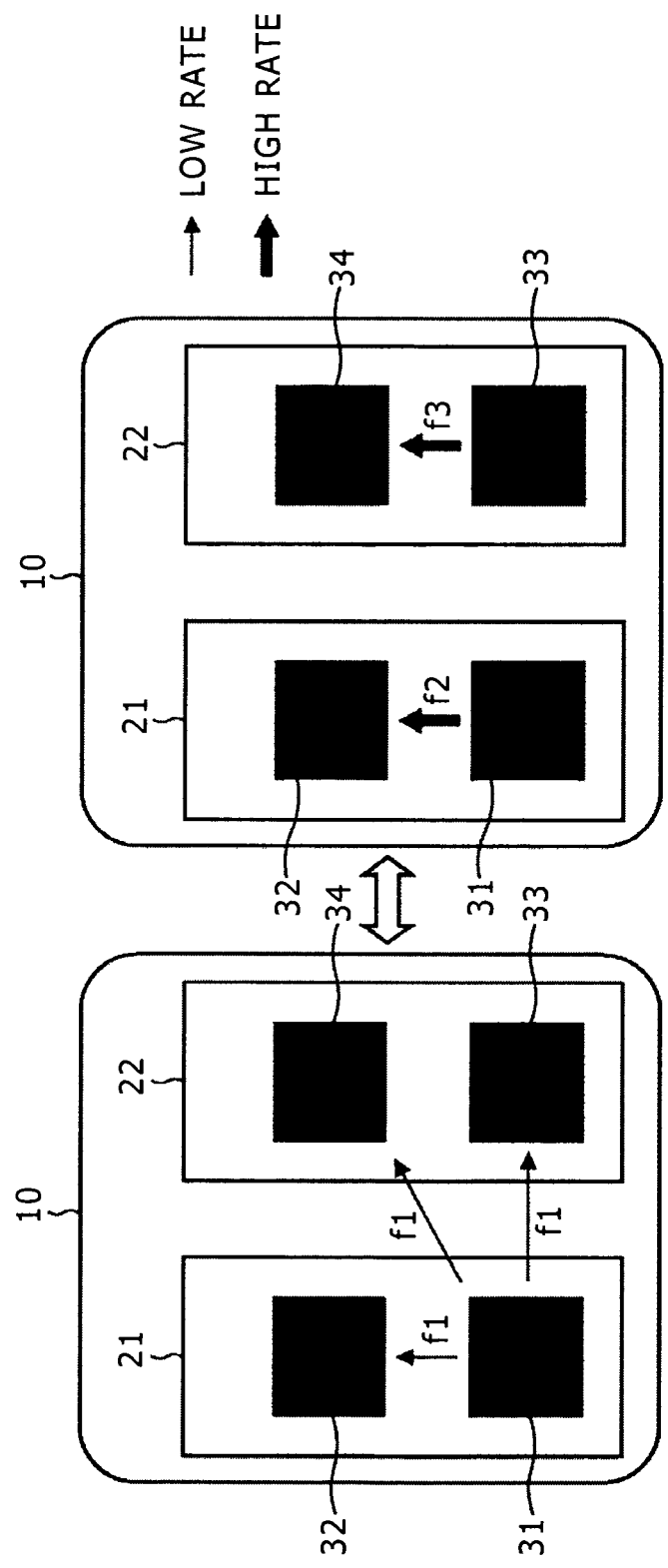
FIG. 10 is an explanatory diagram to be referred to in description of an operation to select a frequency conversion method in accordance with a command received from a signal transmitting apparatus transmitting a modulated signal.

FIG. 10 is an explanatory diagram referred to in the following description of an operation to select a frequency conversion method in accordance with a command received from the signal transmitting apparatus 40 employed in the communication apparatus shown in FIG. 2 to serve as a signal transmitting apparatus for transmitting a modulated signal.

The control block 67 can be set to select typically the square-law detection method by default. In addition, if the signal transmitting apparatus 40 for transmitting the modulated signal issues a command making a request for the injection-locked detection method which is not the default detection method, the control block 67 is capable of selecting the injection-locked detection method in accordance with the command.

In the configuration shown in FIG. 10, the semiconductor chip 31 transmits a modulated signal conveying data of a low rate such as control data for a carrier having a frequency determined in advance to each of the semiconductor chips 32 to 34.

If the semiconductor chip 31 does not issue a command making a request for the injection-locked detection method, the control block 67 included in each of the semiconductor chips 32 to 34 selects the square-law detection method by default. Thus, the signal receiving apparatus 50 employed in the communication apparatus shown in FIG. 2 to serve as a signal receiving apparatus in each of the semiconductor chips 32 to 34 carries out the frequency conversion on the modulated signal received from the semiconductor chip 31 by adoption of the square-law detection method.

Later on, for example, the semiconductor chip 31 transmits a modulated signal conveying data of a high rate such as image data to the semiconductor chip 32 whereas the semiconductor chip 33 also transmits a modulated signal conveying data of a high rate to the semiconductor chip 34. In order for the semiconductor chip 31 to transmit the modulated signal conveying data of a high rate to the semiconductor chip 32 and for the semiconductor chip 33 to transmit the modulated signal conveying data of a high rate to the semiconductor chip 34, the semiconductor chip 31 transmits a modulated signal conveying control data including a command to select the injection-locked detection method to the semiconductor chips 32 and 34 as well as a command to transmit the modulated signal conveying data of a high rate to the semiconductor chip 33. When the semiconductor chip 31 transmits the modulated signal conveying such control data, the control block 67 included in each of the semiconductor chips 32 and 34 selects the injection-locked detection method in accordance with the command included in the control data conveyed by the modulated signal transmitted by the semiconductor chip 31 as a command making a request for the injection-locked detection method.

Then, the semiconductor chip 31 starts the transmission of the modulated signal conveying data of a high rate to the semiconductor chip 32. In addition, the semiconductor chip 33 starts the transmission of the modulated signal conveying data of a high rate to the semiconductor chip 34 in accordance with the command included in the control data conveyed by the modulated signal transmitted by the semiconductor chip 31 to the semiconductor chip 33.

Then, the signal receiving apparatus 50 included in the semiconductor chip 32 carries out the frequency conversion on the modulated signal received from the semiconductor chip 31 as a modulated signal conveying data of a high rate by adoption of the injection-locked detection method. By the same token, the signal receiving apparatus 50 included in the semiconductor chip 34 also carries out the frequency conversion on the modulated signal received from the semiconductor chip 33 as a modulated signal conveying data of a high rate by adoption of the injection-locked detection method.

Later on, when the operation to receive the modulated signal received from the semiconductor chip 31 as a modulated signal conveying data of a high rate has been completed, the control block 67 included in the semiconductor chip 32 selects the square-law detection method.

By the same token, when the operation to receive the modulated signal received from the semiconductor chip 33 as a modulated signal conveying data of a high rate has been completed, the control block 67 included in the semiconductor chip 34 selects the square-law detection method.

It is to be noted that, if the operation carried out by the semiconductor chip 31 to transmit the modulated signal conveying data of a high rate to the semiconductor chip 32 never overlaps the operation carried out by the semiconductor chip 33 to transmit the modulated signal conveying data of a high rate to the semiconductor chip 34 on the time axis, as the frequency f2 of the carrier of the modulated signal transmitted by the semiconductor chip 31 to serve as a modulated signal for conveying data of a high rate and as the frequency f3 of the carrier of the modulated signal transmitted by the semiconductor chip 33 to serve as a modulated signal for conveying data of a high rate, any arbitrary frequencies can be used even if the arbitrary frequencies cause the frequency band of the modulated signal transmitted by the semiconductor chip 31 to overlap the frequency band of the modulated signal transmitted by the semiconductor chip 33.

If the operation carried out by the semiconductor chip 31 to transmit the modulated signal conveying data of a high rate to the semiconductor chip 32 may overlap the operation carried out by the semiconductor chip 33 to transmit the modulated signal conveying data of a high rate to the semiconductor chip 34 on the time axis, on the other hand, as the frequencies f2 and f3, it is necessary to select frequencies that never cause the frequency band of the modulated signal transmitted by the semiconductor chip 31 to overlap the frequency band of the modulated signal transmitted by the semiconductor chip 33.

If the operation carried out by the semiconductor chip 31 to transmit the modulated signal conveying data of a high rate to the semiconductor chip 32 overlaps the operation carried out by the semiconductor chip 33 to transmit the modulated signal conveying data of a high rate to the semiconductor chip 34 on the time axis so that the modulated signal of the carrier having the frequency f2 and the modulated signal of the carrier having the frequency f3 are transmitted at the same time, the frequency conversion section 52 included in the semiconductor chip 32 to serve as a frequency conversion section selecting the injection-locked detection method generates (or oscillates) an LO signal synchronized to the modulated signal of the carrier having the frequency f2 instead of generating the LO signal synchronized to the modulated signal of the carrier having the frequency f3. That is to say, the frequency conversion section 52 generates (or oscillates) the LO signal synchronized to the modulated signal received from the semiconductor chip 31. Then, the frequency conversion section 52 carries out the frequency conversion by making use of the LO signal as the reproduced carrier.

Subsequently, the frequency conversion section 52 included in the semiconductor chip 32 selects the data sequence explained earlier by referring to FIGS. 8A to 8C from a baseband signal obtained as a result of the frequency conversion.

By the same token, the frequency conversion section 52 included in the semiconductor chip 34 to serve as a frequency conversion section selecting the injection-locked detection method generates (or oscillates) an LO signal synchronized to the modulated signal of the carrier having the frequency f3 instead of generating the LO signal synchronized to the modulated signal of the carrier having the frequency f2. That is to say, the frequency conversion section 52 generates (or oscillates) the LO signal synchronized to the modulated signal received from the semiconductor chip 33. Then, the frequency conversion section 52 carries out the frequency conversion by making use of the LO signal as the reproduced carrier. As described above, the modulated signal of the carrier having the frequency f2 and the modulated signal of the carrier having the frequency f3 are transmitted at the same time.

Subsequently, the frequency conversion section 52 included in the semiconductor chip 34 selects the data sequence explained earlier by referring to FIGS. 8A to 8C from a baseband signal obtained as a result of the frequency conversion.

As described above, a method for carrying out frequency conversion on a modulated signal is selected in accordance with the rate of data conveyed by the modulated signal and/or a command issued by the signal transmitting apparatus 40 transmitting the modulated signal as a command making a request for the method. In addition, a method for carrying out frequency conversion on a modulated signal can also be selected in accordance with another technique described as follows.

For example, a method for carrying out frequency conversion on a modulated signal is selected in accordance with the level of the received modulated signal. To put it concretely, if the level of the received modulated signal is low, the injection-locked detection method providing a relatively broad signal receiving range is selected. If the level of the received modulated signal is high, on the other hand, the square-law detection method providing a relatively narrow signal receiving range is selected.

It is to be noted that, since the injection-locked detection method provides a relatively broad signal receiving range, the control block 67 is capable of always selecting the injection-locked detection method without regard to the level of the received modulated signal.

In comparison with the injection-locked detection method in which the negative-resistance circuit 63 functions as a negative-resistance resistor, however, the square-law detection method entails only low power consumption. Thus, if the level of the received modulated signal is high, the square-law detection method is selected. In this way, the power consumption can be reduced to a small value in comparison with a configuration in which the control block 67 always selects the injection-locked detection method without regard to the level of the received modulated signal.

In addition, even though the distance between two semiconductor chips communicating with each other can be made sufficiently short, there is a case in which the distance must be made relatively long as described below.

For example, in the case of three semiconductor chips used as first to third chips respectively, the first chip receives a modulated signal transmitted by the second chip and a modulated signal transmitted by the third chip. In addition, even though the distance between the first and second chips can be set at D1 which is a relatively short distance, the distance between the first and third chips must be set only at D2 which is longer than D1.

In the case described above, the control block 67 included in the first chip receiving modulated signals transmitted by the second and third chips is made capable of selecting a method for carrying out frequency conversion on a modulated signal in accordance with whether the communication partner transmitting the modulated signal is the second or third chip.

To be more specific, if the communication partner transmitting the modulated signal is the second chip separated away from the first chip by the relatively short distance D1, after consideration of the fact that the level of the modulated signal received from the second chip separated away from the first chip by such a short distance D1 is high, the control block 67 included in the first chip is capable of selecting the square-law detection method providing a relatively narrow signal receiving range.

If the communication partner transmitting the modulated signal is the third chip separated away from the first chip by the distance D2 longer than distance D1, on the other hand, after consideration of the fact that the level of the modulated signal received from the third chip separated away from the first chip by such a long distance D2 is low, the control block 67 included in the first chip is capable of selecting the injection-locked detection method providing a relatively broad signal receiving range.

In addition, as described above, let the first chip receive modulated signals transmitted by the second and third chips for example. Also let the modulated signal transmitted by the second chip be a modulated signal obtained as a result of modulating a carrier whereas the modulated signals received from the third chip be a plurality of modulated signals obtained as a result of modulating the same plurality of carriers and transmitted by the third chip on a frequency-allocation basis. In this case, the control block 67 included in the first chip is also capable of selecting a frequency conversion method in accordance with whether the communication partner transmitting the modulated signal is the second or third chip.

To be more specific, if the communication partner transmitting the modulated signal obtained as a result of modulating a carrier is the second chip, the control block 67 included in the first chip is capable of selecting the square-law detection method even though, with the square-law detection method adopted, it is difficult to select the data sequence explained earlier by referring to FIGS. 8A to 8C from a baseband signal. The control block 67 included in the first chip adopts the square-law detection method because it is not necessary to select the data sequence from a baseband signal anyway and because the square-law detection method entails only small power consumption.

If the communication partner transmitting the modulated signals obtained as a result of modulating a plurality of carriers is the third chip, on the other hand, the control block 67 included in the first chip is capable of selecting the injection-locked detection method allowing the data sequence explained earlier by referring to FIGS. 8A to 8C to be selected from a baseband signal. The control block 67 included in the first chip adopts the injection-locked detection method because it is necessary to select the data sequence from a baseband signal.

In addition, the control block 67 typically selects the injection-locked detection method by default. Depending on the state of synchronization carried out by the frequency conversion section 52, however, the control block 67 is capable of changing the frequency conversion method. For example, if the LO signal used as the reproduced carrier cannot be synchronized to the modulated signal by adoption of the injection-locked detection method, the control block 67 is capable switching the frequency conversion method from the injection-locked detection method to the square-law detection method.

On top of that, the control block 67 is capable of selecting a frequency conversion method in accordance with a command making a request for the frequency conversion method. Such a command can be issued by the user operating, among others, a mechanical operation section or an operation section (not shown) of the GUI (Graphical User Interface).

Second Embodiment

[Typical Configuration of an Electronic Apparatus According to a Second Embodiment]

Figure 11:
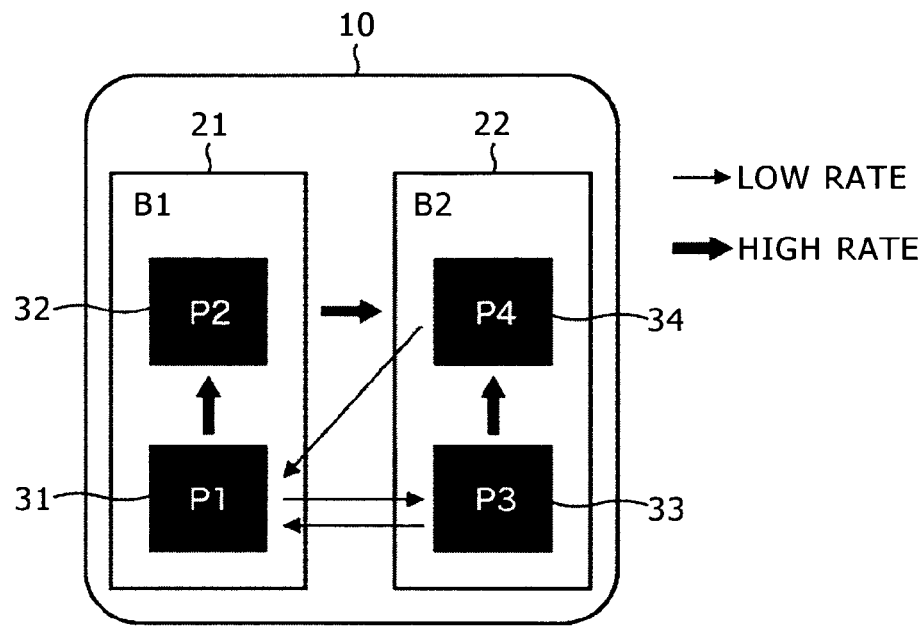
FIG. 11 is a diagram showing a top view of a typical configuration of an electronic apparatus according to a second embodiment of the present disclosure.

FIG. 11 is a diagram showing a top view of a typical configuration of an electronic apparatus according to a second embodiment of the present disclosure.

It is to be noted that, in the configuration shown in the figure, portions corresponding to their respective counterparts shown in FIG. 1 are denoted by the same reference numerals as the counterparts and the explanations thereof are not repeated in the following description.

The case 10 of the electronic apparatus shown in FIG. 11 accommodates the board 21 on which the semiconductor chips 31 and 32 are mounted as well as the board 22 on which the semiconductor chips 33 and 34 are mounted. Thus, the electronic apparatus shown in FIG. 11 has a configuration identical with that of the electronic apparatus shown in FIG. 1.

In the case of the electronic apparatus shown in FIG. 11, however, frequency conversion methods adopted for carrying out frequency conversions are fixed methods each selected from the beginning once and for all by one of the frequency conversion sections 52 each included in one of the semiconductor chips 31 to 34.

In the electronic apparatus shown in FIG. 1, on the other hand, the frequency conversion sections 52 each included in one of the semiconductor chips 31 to 34 are capable of selecting frequency conversion methods among a plurality of frequency conversion methods from time to time in the so-called dynamical manner and carrying out frequency conversions by adoption of the selected frequency conversion methods.

That is to say, in the electronic apparatus shown in FIG. 11, the frequency conversion sections 52 each included in one of the semiconductor chips 31 to 34 are capable of carrying out frequency conversions by adoption of any ones selected among a plurality of frequency conversion methods in the same way as the electronic apparatus shown in FIG. 1. However, the electronic apparatus shown in FIG. 11 is different from the electronic apparatus shown in FIG. 1 in that, in the case of the electronic apparatus shown in FIG. 11, the frequency conversion sections 52 each included in one of the semiconductor chips 31 to 34 each select a fixed frequency conversion method from the beginning once and for all among a plurality of frequency conversion methods and carry out the frequency conversion by adoption of the fixed frequency conversion method selected from the beginning once and for all among a plurality of frequency conversion methods.

In the electronic apparatus shown in FIG. 11, for all the semiconductor chips 31 to 34, only one frequency conversion method is selected from the beginning once and for all in accordance with the received modulated signal as follows.

In the electronic apparatus shown in FIG. 11, the semiconductor chip 31 may transmit a modulated signal conveying data of a high rate to the semiconductor chip 32 and a modulated signal conveying data of a low rate to the semiconductor chip 33.

In addition, the semiconductor chip 32 may transmit a modulated signal conveying data of a high rate to the semiconductor chip 34.

On top of that, the semiconductor chip 33 may transmit a modulated signal conveying data of a low rate to the semiconductor chip 31 and a modulated signal conveying data of a high rate to the semiconductor chip 34.

Furthermore, the semiconductor chip 34 may transmit a modulated signal conveying data of a low rate to the semiconductor chip 31.

Thus, in the electronic apparatus shown in FIG. 11, the semiconductor chip 31 may receive modulated signals each conveying data of a low rate from the semiconductor chips 33 and 34 but never receives a modulated signal conveying data of a high rate.

In addition, the semiconductor chip 32 may receive a modulated signal conveying data of a high rate from the semiconductor chip 31 but never receives a modulated signal conveying data of a low rate.

On top of that, the semiconductor chip 33 may receive a modulated signal conveying data of a low rate from the semiconductor chip 31 but never receives a modulated signal conveying data of a high rate.

Furthermore, the semiconductor chip 34 may receive modulated signals each conveying data of a high rate from the semiconductor chips 32 and 33 but never receives a modulated signal conveying data of a low rate.

As is obvious from the above descriptions, in the electronic apparatus shown in FIG. 11, each of the semiconductor chips 31 and 33 may receive a modulated signal conveying data of a low rate but never receives a modulated signal conveying data of a high rate. Thus, from the beginning, the frequency conversion section 52 included in each of the semiconductor chips 31 and 33 selects once and for all a frequency conversion method proper for frequency conversions to be carried out on modulated signals each conveying data of a low rate. A typical example of such a frequency conversion method is the square-law detection method.

On the other hand, each of the semiconductor chips 32 and 34 may receive a modulated signal conveying data of a high rate but never receives a modulated signal conveying data of a low rate. Thus, from the beginning, the frequency conversion section 52 included in each of the semiconductor chips 32 and 34 selects once and for all a frequency conversion method proper for frequency conversions to be carried out on modulated signals each conveying data of a high rate. A typical example of such a frequency conversion method is the injection-locked detection method.

As described above, in the electronic apparatus shown in FIG. 11, the frequency conversion sections 52 each included in one of the semiconductor chips 31 to 34 adopt frequency conversion methods different from each other due to the modulated signals received by the semiconductor chips 31 to 34.

It is to be noted that, even if a frequency conversion method selected from the beginning once and for all among a plurality of frequency conversion methods is adopted as a fixed frequency conversion method, the frequency conversion section 52 can have the configuration explained earlier by referring to FIGS. 3 to 6. As explained earlier by referring to FIGS. 3 to 6, the frequency conversion section 52 is capable of dynamically selecting any frequency conversion method among a plurality of frequency conversion methods as a frequency conversion method to be adopted in carrying out the frequency conversion.

In the case of the electronic apparatus shown in FIG. 11, however, the frequency conversion method is fixed to one specific frequency conversion method selected from the beginning once and for all among a plurality of frequency conversion methods. Thus, the frequency conversion section 52 can be configured to be capable of carrying out the frequency conversion by adoption of only the specific frequency conversion method selected from the beginning once and for all among a plurality of frequency conversion methods.

That is to say, for the semiconductor chips 31 and 33 employed in the electronic apparatus shown in FIG. 11, the frequency conversion method is fixed to the square-law detection method. Thus, the frequency conversion section 52 included in each of the semiconductor chips 31 and 33 can be configured to be capable of carrying out the frequency conversion by adoption of only the square-law detection method. For the semiconductor chips 32 and 34 employed in the electronic apparatus shown in FIG. 11, on the other hand, the frequency conversion method is fixed to the injection-locked detection method. Thus, the frequency conversion section 52 included in each of the semiconductor chips 32 and 34 can be configured to be capable of carrying out the frequency conversion by adoption of only the injection-locked detection method.

Figure 12:
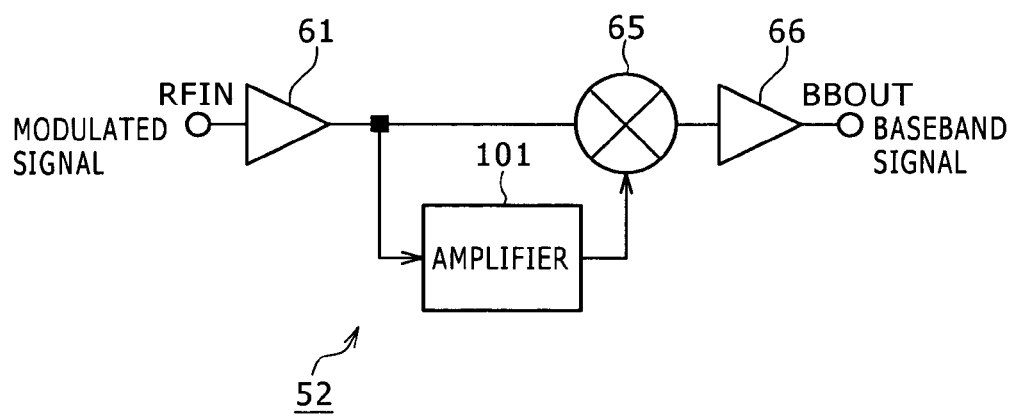
FIG. 12 is an explanatory diagram showing the frequency conversion section for carrying out operations of frequency conversion by adoption of only the square-law detection method.

FIG. 12 is an explanatory diagram showing the frequency conversion section 52 for carrying out operations of the frequency conversion by adoption of only the square-law detection method.

In the configuration shown in FIG. 12, portions corresponding to their respective counterparts shown in FIG. 3 are denoted by the same reference numerals as the counterparts and the explanations thereof are not repeated in the following description.

The frequency conversion section 52 shown in FIG. 12 employs an RF amplifier 61, a mixer 65 and a BB amplifier 66 as the frequency conversion section 52 shown in FIG. 3 does.

However, the frequency conversion section 52 shown in FIG. 12 is different from the frequency conversion section 52 shown in FIG. 3 in that the frequency conversion section 52 shown in FIG. 12 does not employ a voltage-to-current conversion circuit 62, a negative-resistance circuit 63, an LC resonance circuit 64 and a control block 67 but newly employs an amplifier 101 as an additional component.

In the frequency conversion section 52 shown in FIG. 12, the RF amplifier 61 supplies a modulated signal to the amplifier 101.

The amplifier 101 has the same function as the function of the amplifier formed by the voltage-to-current conversion circuit 62 and the LC resonance circuit 64 as explained earlier by referring to FIG. 5. The amplifier 101 amplifies the modulated signal received from the RF amplifier 61 in order to generate an amplified signal and supplies the amplified signal obtained as a result of the amplification to the mixer 65.

The mixer 65 mixes the modulated signal received from the RF amplifier 61 with the amplified signal received from the amplifier 101. That is to say, the mixer 65 takes the square of the modulated signal in square-law detection carried out on the modulated signal in order to generate a baseband signal. Then, the mixer 65 supplies the baseband signal to the BB amplifier 66.

Figure 13:
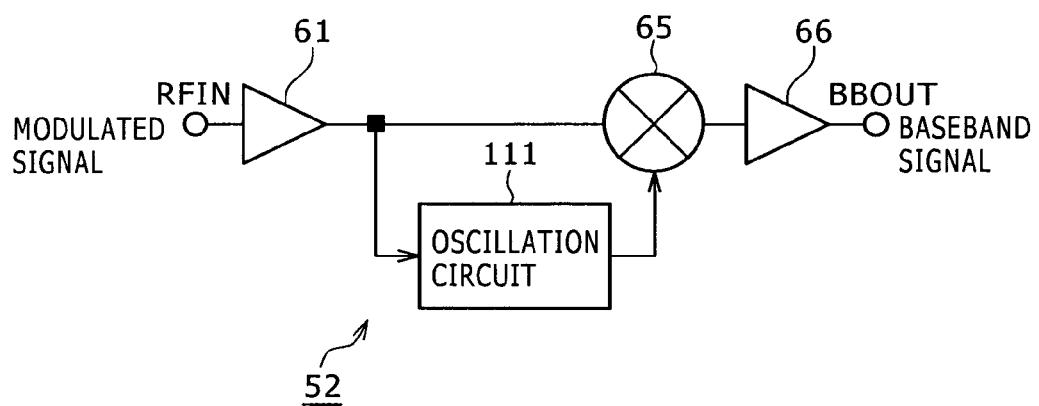
FIG. 13 is an explanatory diagram showing the frequency conversion section for carrying out operations of frequency conversion by adoption of only the injection-locked detection method.

FIG. 13 is an explanatory diagram showing the frequency conversion section 52 for carrying out operations of the frequency conversion by adoption of only the injection-locked detection method.

In the configuration shown in FIG. 13, portions corresponding to their respective counterparts shown in FIG. 3 are denoted by the same reference numerals as the counterparts and the explanations thereof are not repeated in the following description.

The frequency conversion section 52 shown in FIG. 13 employs an RF amplifier 61, a mixer 65 and a BB amplifier 66 as the frequency conversion section 52 shown in FIG. 3 does.

However, the frequency conversion section 52 shown in FIG. 13 is different from the frequency conversion section 52 shown in FIG. 3 in that the frequency conversion section 52 shown in FIG. 13 does not employ a voltage-to-current conversion circuit 62, a negative-resistance circuit 63, an LC resonance circuit 64 and a control block 67 but newly employs an oscillation circuit 111 as an additional component.

In the frequency conversion section 52 shown in FIG. 13, the oscillation circuit 111 receives a modulated signal generated by the RF amplifier 61 as an injected signal.

The oscillation circuit 111 has the same function as the function of the oscillation circuit formed by the negative-resistance circuit 63 and the LC resonance circuit 64 as explained earlier by referring to FIG. 4. The oscillation circuit 111 generates (or oscillates) an LO signal synchronized to the modulated signal supplied by the RF amplifier 61 as an injected signal. The oscillation circuit 111 supplies the LO signal to the mixer 65 as a reproduced carrier.

The mixer 65 mixes the modulated signal received from the RF amplifier 61 with the reproduced carrier received from the oscillation circuit 111 in injection-locked detection carried out on the modulated signal in order to generate a baseband signal. Then, the mixer 65 supplies the baseband signal to the BB amplifier 66.

It is to be noted that implementations of the present technology are by no means limited to the embodiments described so far. That is to say, a variety of changes can be made to the embodiments as long as the changes fall within a range not deviating from essentials of the present technology.

In the case of the electronic apparatus shown in FIG. 11 for example, for some of the semiconductor chips 31 to 34, the frequency conversion section 52 can be designed to be capable of carrying out frequency conversions by adoption of only a frequency conversion method selected from the beginning once and for all among a plurality of frequency conversion methods. For the remaining semiconductor chips, on the other hand, the frequency conversion section 52 can be designed to be capable of dynamically selecting a frequency conversion method from a plurality of frequency conversion methods and carrying out frequency conversions by adoption of the selected frequency conversion method.

The present disclosure contains subject matter related to that disclosed in Japanese Priority Patent Application JP 2010-255569 filed in the Japan Patent Office on Nov. 16, 2010, the entire content of which is hereby incorporated by reference.

What is claimed is:

1. A signal receiving apparatus comprising:
an input configured to receive a modulated signal through a radio transmission; and
a frequency conversion section configured to carry out frequency conversion on the modulated signal,
wherein the frequency conversion section carries out the frequency conversion by adoption of a frequency conversion technique selected from a plurality of frequency conversion techniques adoptable by the frequency conversion section in the frequency conversion to be executed on the modulated signal,
the frequency conversion techniques comprise an injection-locked detection technique and a square-law detection technique, and
the frequency conversion section converts the modulated signal into a baseband signal by adoption of one of the injection-locked detection technique and the square-law detection technique.

2. The signal receiving apparatus according to claim 1, wherein the frequency conversion section includes:
a voltage-to-current conversion circuit configured to carry out voltage-to-current conversion on the modulated signal;
a resonance circuit configured to receive an output signal generated by the voltage-to-current conversion circuit as a result of the voltage-to-current conversion carried out by the voltage-to-current conversion circuit on the modulated signal;
a negative-resistance circuit connected to the resonance circuit and provided with a negative-resistance function which can be activated and deactivated; and
a mixer for mixing the modulated signal with a signal output by the resonance circuit.

3. The signal receiving apparatus according to claim 2, wherein:
when the frequency conversion section carries out the frequency conversion by adoption of the injection-locked detection technique,
the negative-resistance function of the negative-resistance circuit is activated in order to form an oscillation circuit from the resonance circuit and the negative-resistance circuit,
the output signal generated by the voltage-to-current conversion circuit is supplied to the oscillation circuit in order to generate a reproduced carrier synchronized to the modulated signal to be output from the oscillation circuit, and
the mixer mixes the modulated signal with the reproduced carrier; and
when the frequency conversion section carries out the frequency conversion by adoption of the square-law detection technique,
the negative-resistance function of the negative-resistance circuit is deactivated,
the voltage-to-current conversion circuit and the resonance circuit form an amplifier,
the amplifier amplifies the modulated signal in order to generate and output an amplified signal, and
the mixer mixes the modulated signal with the amplified signal.

4. The signal receiving apparatus according to claim 2, wherein the voltage-to-current conversion circuit is capable of adjusting the gain of the voltage-to-current conversion.

5. The signal receiving apparatus according to claim 2, wherein the resonance circuit is capable of adjusting the resonance frequency thereof.

6. The signal receiving apparatus according to claim 2, wherein:
the voltage-to-current conversion circuit is configured to include a differential amplifier having a pair of transistors; and
the negative-resistance circuit is configured to include a pair of transistors connected to each other to form a cross-coupling connection.

7. The signal receiving apparatus according to claim 1, wherein the signal receiving apparatus accommodates a case with a signal transmitting apparatus transmitting the modulated signal.

8. The signal receiving apparatus according to claim 1, wherein the modulated signal is a signal in a milli-wave band.

9. The signal receiving apparatus according to claim 1, wherein the frequency conversion section is created on one semiconductor chip.

10. A signal receiving apparatus comprising:
an input configured to receive a modulated signal through a radio transmission; and
a frequency conversion section configured to carry out frequency conversion on the modulated signal,
wherein the frequency conversion section carries out the frequency conversion by adoption of a frequency conversion technique selected from a plurality of frequency conversion techniques adoptable by the frequency conversion section in the frequency conversion to be executed on the modulated signal, and the frequency conversion section selects the frequency conversion technique in accordance with an operation carried out on an operation section as an operation making a request for the frequency conversion technique.

11. A signal receiving apparatus comprising:
an input configured to receive a modulated signal through a radio transmission; and
a frequency conversion section configured to carry out frequency conversion on the modulated signal,
wherein the frequency conversion section carries out the frequency conversion by adoption of a frequency conversion technique selected from a plurality of frequency conversion techniques adoptable by the frequency conversion section in the frequency conversion to be executed on the modulated signal,
wherein the frequency conversion section selects the frequency conversion technique in accordance with a data rate of the modulated signal.

12. A signal receiving apparatus comprising:
an input configured to receive a modulated signal through a radio transmission; and
a frequency conversion section configured to carry out frequency conversion on the modulated signal,
wherein the frequency conversion section carries out the frequency conversion by adoption of a frequency conversion technique selected from a plurality of frequency conversion techniques adoptable by the frequency conversion section in the frequency conversion to be executed on the modulated signal,
wherein the frequency conversion section selects the frequency conversion technique in accordance with the level of the modulated signal.

13. A signal receiving apparatus comprising:
an input configured to receive a modulated signal through a radio transmission; and
a frequency conversion section configured to carry out frequency conversion on the modulated signal, technique,
wherein the frequency conversion section carries out the frequency conversion by adoption of a frequency conversion technique selected from a plurality of frequency conversion techniques adoptable by the frequency conversion section in the frequency conversion to be executed on the modulated signal,
wherein the frequency conversion section selects the frequency conversion technique in accordance with a command received from a signal transmitting apparatus transmitting the modulated signal.

14. A signal receiving method for a signal receiving apparatus having a frequency conversion section configured to carry out frequency conversion on a modulated signal received by the signal receiving apparatus according to a radio transmission technique, the method comprising:
carrying out, by the frequency conversion section, the frequency conversion by adoption of a frequency conversion method selected from a plurality of frequency conversion methods adoptable by the frequency conversion section in the frequency conversion to be executed on the modulated signal, wherein
the frequency conversion methods comprise an injection-locked detection method and a square-law detection method, and
the frequency conversion section converts the modulated signal into a baseband signal by adoption of one of the injection-locked detection method and the square-law detection method.

15. An electronic apparatus having a case for accommodating:
one or more semiconductor chips each including a signal transmitting apparatus created therein for transmitting a modulated signal obtained as a result of modulation of a carrier by adoption of a radio transmission technique; and
a plurality of semiconductor chips each including a signal receiving apparatus created therein for receiving said modulated signal, wherein
each of said signal receiving apparatus has a frequency conversion section used for carrying out frequency conversion on said modulated signal,
any specific one of said frequency conversion sections is included in a specific one of said semiconductor chips whereas another one of said frequency conversion sections is included in another one of said semiconductor chips, and
said specific frequency conversion section carries out said frequency conversion by adoption of a specific frequency conversion method selected from a plurality of frequency conversion methods adoptable for said frequency conversion whereas said other frequency conversion section carries out said frequency conversion by adoption of another frequency conversion method which is selected from said frequency conversion methods adoptable for said frequency conversion as a frequency conversion method different from said specific frequency conversion method.

16. The electronic apparatus according to claim 15, wherein:
said frequency conversion methods are an injection-locked detection method and a square-law detection method;
said specific frequency conversion section included in said specific semiconductor chip converts said modulated signal into a baseband signal by adoption of said injection-locked detection method; and
said other frequency conversion section included in said other semiconductor chip converts said modulated signal into said baseband signal by adoption of said square-law detection method.

17. The electronic apparatus according to claim 15, wherein said modulated signal is a signal in a milli-wave band.

* * * * *